United States Patent
Moon et al.

(10) Patent No.: US 11,233,065 B2
(45) Date of Patent: Jan. 25, 2022

(54) NONVOLATILE MEMORY DEVICE AND METHOD FOR FABRICATING THE SAME

(71) Applicant: SAMSUNG ELECTRONICS CO., LTD., Suwon-si (KR)

(72) Inventors: Je Suk Moon, Suwon-si (KR); Seo-Goo Kang, Suwon-si (KR); Young Hwan Son, Suwon-si (KR); Kohji Kanamori, Suwon-si (KR); Jee Hoon Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 84 days.

(21) Appl. No.: 16/718,498

(22) Filed: Dec. 18, 2019

(65) Prior Publication Data

US 2020/0381449 A1 Dec. 3, 2020

(30) Foreign Application Priority Data

May 30, 2019 (KR) .................. 10-2019-0063805

(51) Int. Cl.
*H01L 27/11578* (2017.01)
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ................................ H01L 27/11578
See application file for complete search history.

(56) References Cited

U.S. PATENT DOCUMENTS

| 8,427,881 | B2 | 4/2013 | Jang et al. |
| 8,644,046 | B2 | 2/2014 | Seol et al. |
| 9,219,070 | B2 | 12/2015 | Thimmegowda et al. |
| 9,263,462 | B2 | 2/2016 | Eom |
| 9,859,207 | B2 | 1/2018 | Kim |
| 10,074,665 | B2 | 9/2018 | Kawaguchi et al. |
| 2017/0287928 | A1 | 10/2017 | Kanamori et al. |
| 2019/0296040 | A1* | 9/2019 | Fujii .................. H01L 27/11582 |
| 2020/0265897 | A1* | 8/2020 | Lu .......................... G11C 16/16 |

* cited by examiner

*Primary Examiner* — Christopher A Johnson
(74) *Attorney, Agent, or Firm* — Lee IP Law, P.C.

(57) ABSTRACT

A nonvolatile memory device includes a mold structure having a stack of word lines on a substrate and first and second string selection lines on the word lines, a first cutting structure through the mold structure, a second cutting structure through the mold structure, the second cutting structure being spaced apart from the first cutting structure, a channel structure penetrating the mold structure to be connected to the substrate, the channel structure being between the first and second cutting structures, a first cutting line cutting through the first string selection line but not through the second string selection line, the first cutting line being between the first and second cutting structures, and a second cutting line cutting through the second string selection line but not through the first string selection line, the second cutting line being between the second cutting structure and the channel structure.

20 Claims, 25 Drawing Sheets

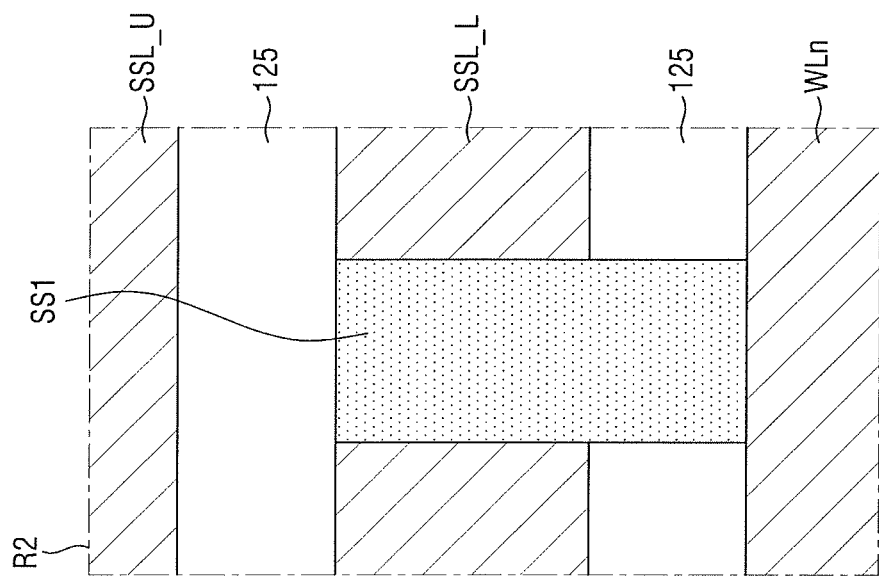

NONVOLATILE MEMORY DEVICE AND METHOD FOR FABRICATING THE SAME

CROSS-REFERENCE TO RELATED APPLICATION

Korean Patent Application No. 10-2019-0063805, filed on May 30, 2019, in the Korean Intellectual Property Office, and entitled: "Nonvolatile Memory Device and Method for Fabricating the Same," is incorporated by reference herein in its entirety.

BACKGROUND

1. Field

The present disclosure relates to a nonvolatile memory device and a method for fabricating the same. More particularly, the present disclosure relates to a nonvolatile memory device including a plurality of string selection lines and a method for fabricating the same.

2. Description of the Related Art

Semiconductor memory devices may be broadly divided into volatile memory devices and nonvolatile memory devices. The degree of integration of the nonvolatile memory device has increased to satisfy excellent performance and low cost required by consumers. Incidentally, in the case of a two-dimensional or planar memory device, the degree of integration is determined by an area occupied by unit memory cells. Therefore, recently, a three-dimensional memory device in which the unit memory cells are disposed vertically has been developed.

SUMMARY

According to an aspect of the present disclosure, there is provided a nonvolatile memory device including a mold structure on a substrate, the mold structure including a stack of word lines and string selection lines, and the string selection lines including first and second string selection lines on the word lines, a first cutting structure through the mold structure, a second cutting structure through the mold structure, the second cutting structure being spaced apart from the first cutting structure, a channel structure penetrating the mold structure to be connected to the substrate, the channel structure being between the first and second cutting structures, a first cutting line through the first string selection line but not through the second string selection line, the first cutting line being between the first and second cutting structures, and a second cutting line through the second string selection line but not through the first string selection line, the second cutting line being between the second cutting structure and the channel structure.

According to another aspect of the present disclosure, there is provided a nonvolatile memory device including a mold structure which includes a plurality of word lines stacked on a substrate, and first and second string selection lines sequentially stacked on the plurality of word lines, first to third channel structures which penetrate the mold structure, are connected to the substrate and are arranged sequentially, a first cutting line which cuts the first string selection line between the first channel structure and the second channel structure, and a second cutting line which cuts the second string selection line between the second channel structure and the third channel structure, wherein an upper surface of the first cutting line is lower than or equal to a bottom surface of the second string selection line, and a bottom surface of the second cutting line is higher than or equal to an upper surface of the first string selection line.

According to yet another aspect of the present disclosure, there is provided a nonvolatile memory device including a mold structure which includes a plurality of word lines stacked on a substrate, and n (here, n is a natural number of 2 or more) string selection lines stacked on the plurality of word lines, a first word line cutting region which cuts the mold structure, a second word line cutting region spaced apart from the first word line cutting region to cut the mold structure, and n cutting lines which cut each of the n string selection lines, between the first word line cutting region and the second word line cutting region, wherein the n cutting lines are spaced apart from each other in a plan view.

According to still another aspect of the present disclosure, there is provided a method for fabricating a nonvolatile memory device, including forming a first sacrificial pattern and an insulating pattern alternately stacked on a substrate, forming a second sacrificial pattern on the first sacrificial pattern and the insulating pattern, forming a first cutting line which cuts the second sacrificial pattern, forming a third sacrificial pattern on the second sacrificial pattern and the first cutting line, forming a second cutting line which is spaced apart from the first cutting line in a plan view and cuts the third sacrificial pattern, forming first and second word line cutting regions which penetrate the first to third sacrificial patterns and the insulating pattern and are spaced apart from each other with the second sacrificial pattern and the third sacrificial pattern interposed therebetween, replacing the first to third sacrificial patterns with a plurality of conductive patterns, using the first and second word line cutting regions.

According to yet another aspect of the present disclosure, there is provided a method for fabricating a nonvolatile memory device, including forming a first sacrificial pattern and an insulating pattern alternately stacked on a substrate, forming a second sacrificial pattern on the first sacrificial pattern and the insulating pattern, forming a first cutting line which cuts the second sacrificial pattern, forming a third sacrificial pattern on the second sacrificial pattern and the first cutting line, forming a second cutting line which cuts the third sacrificial pattern, forming a channel structure which penetrates the first to third sacrificial patterns and the insulating pattern and is connected to the substrate, between the first cutting line and the second cutting line, forming first and second word line cutting regions which penetrate the first to third sacrificial patterns and the insulating pattern and are spaced apart from each other with the second sacrificial pattern and the third sacrificial pattern interposed therebetween, and replacing the first to third sacrificial patterns with a plurality of conductive patterns, using the first and second word line cutting regions.

BRIEF DESCRIPTION OF THE DRAWINGS

Features will become apparent to those of skill in the art by describing in detail exemplary embodiments with reference to the attached drawings, in which:

FIGS. 4a to 4d illustrate various enlarged views of portion R2 of FIG. 2.

DETAILED DESCRIPTION

Hereinafter, a nonvolatile memory device according to some embodiments of the present disclosure will be described with reference to FIGS. 1 to 13.

Figure 1:
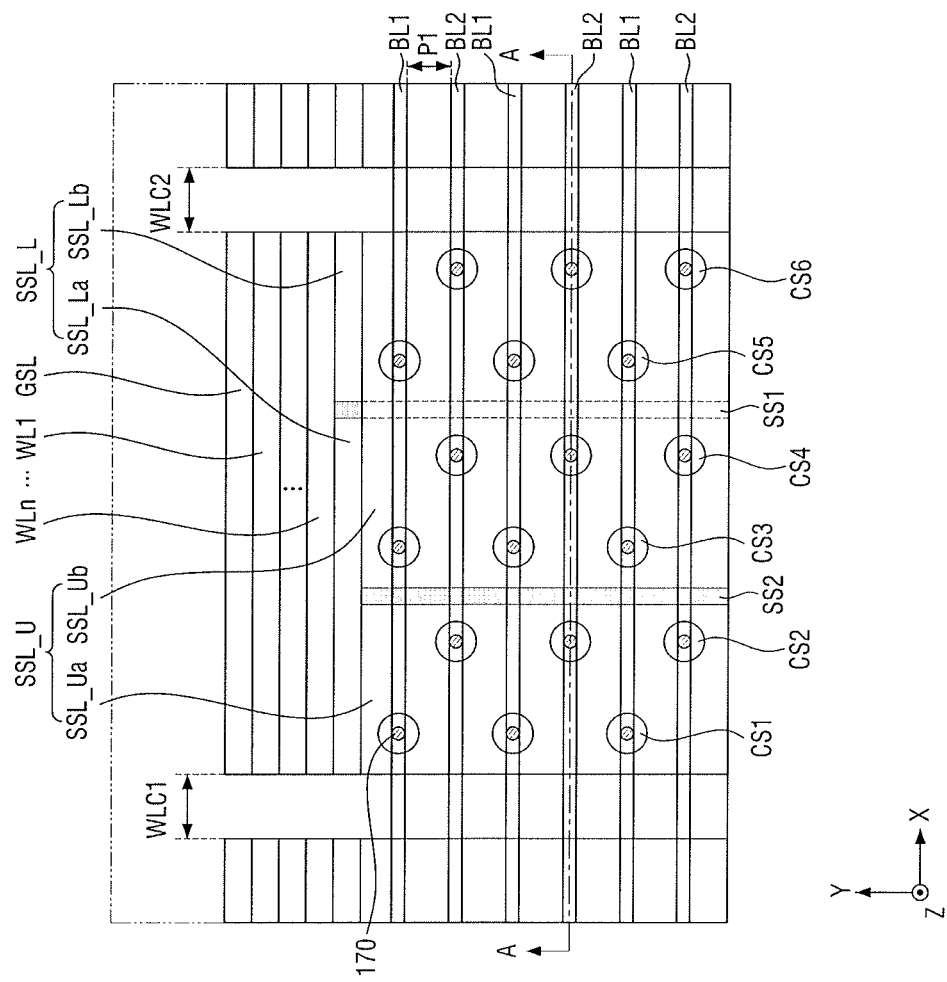
FIG. 1 illustrates a layout view of a nonvolatile memory device according to some embodiments.
Figure 2:
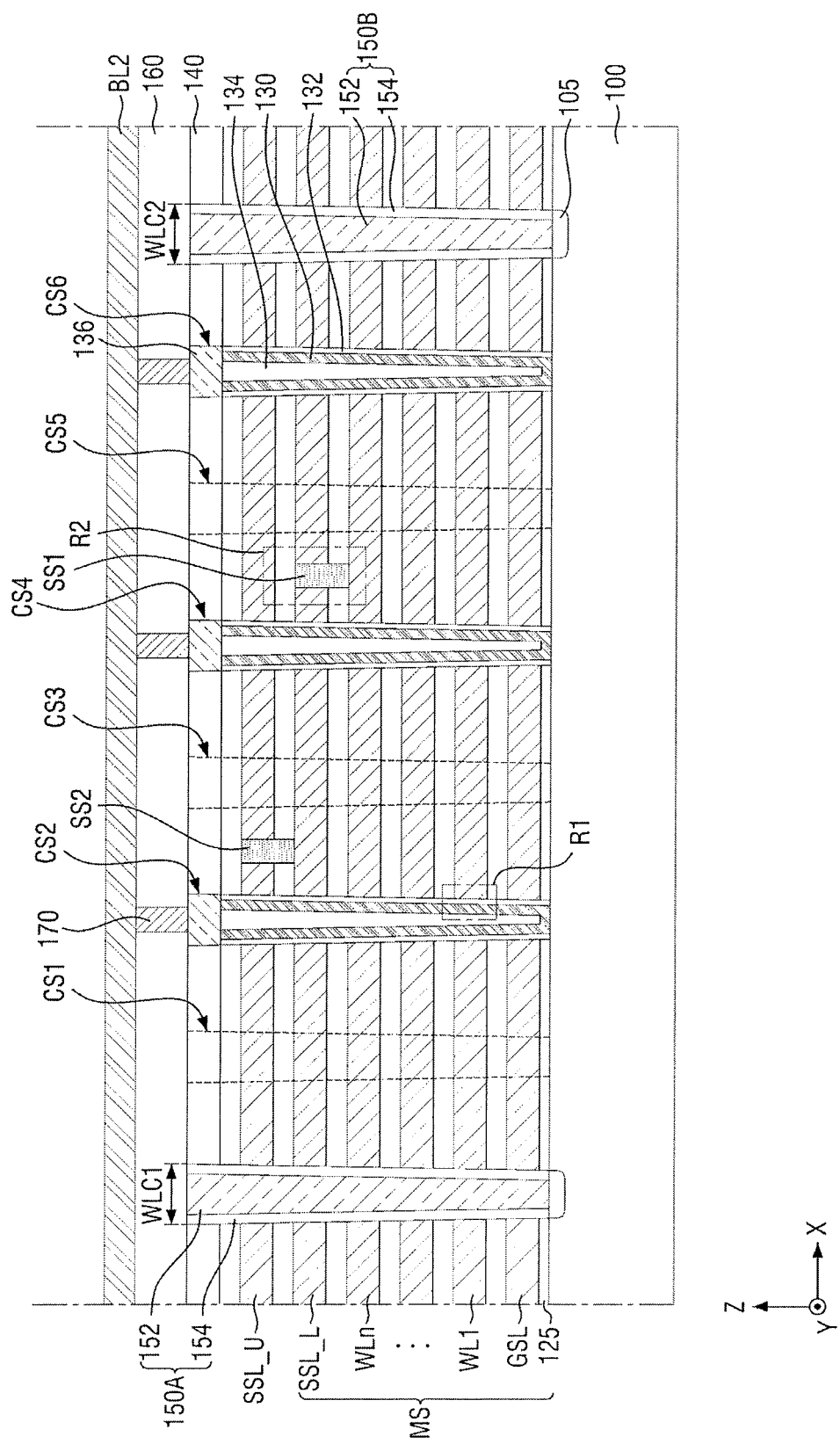
FIG. 2 illustrates a cross-sectional view taken along line A-A of FIG. 1.
Figure 3:
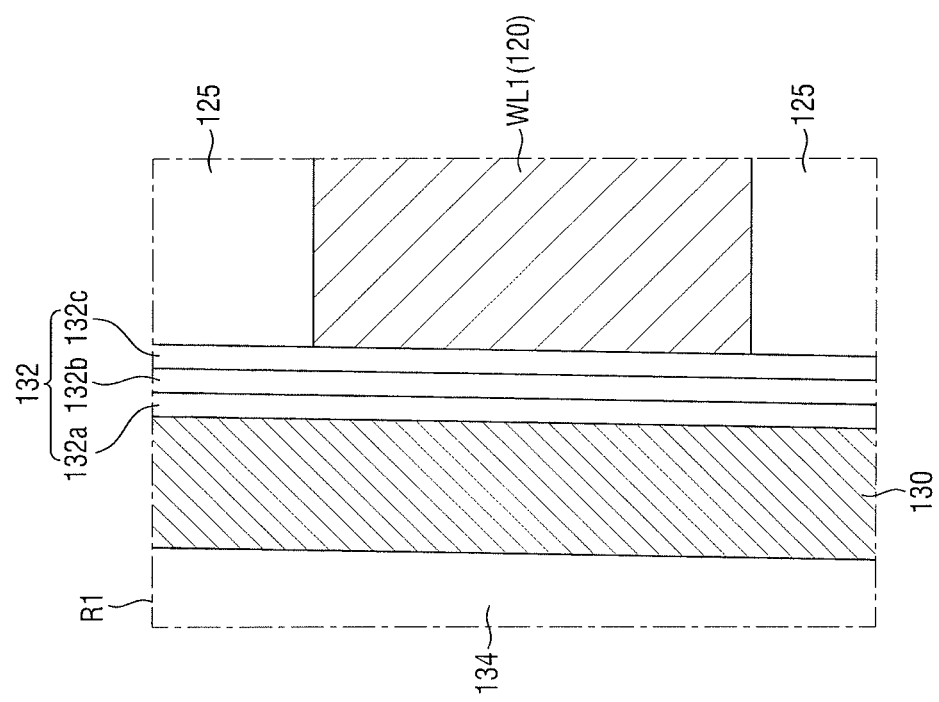
FIG. 3 illustrates an enlarged view of portion R1 of FIG. 2.

FIG. 1 is a layout view of a nonvolatile memory device according to some embodiments. FIG. 2 is a cross-sectional view along line A-A of FIG. 1, FIG. 3 is an enlarged view of portion R1 of FIG. 2, and FIGS. 4a-4d are various enlarged views of portion R2 of FIG. 2.

Referring to FIGS. 1 and 2, a nonvolatile memory device according to some embodiments may include a substrate 100, a mold structure MS, a plurality of channel structures CS1 to CS6, a plurality of cutting lines SS1 and SS2, and a plurality of bit lines BL1 and BL2.

For example, the substrate 100 may include a semiconductor substrate, e.g., a silicon substrate, a germanium substrate, or a silicon-germanium substrate. In another example, the substrate 100 may include a silicon-on-insulator (SOI) substrate, a germanium-on-insulator (GOI) substrate, or the like.

The mold structure MS may be formed on the substrate 100. The mold structure MS may include a plurality, e.g., a stack, of gate electrodes GSL, WL1 to WLn, SSL_L, and SSL_U, and a plurality of insulating patterns 125 formed on the substrate 100. For example, each of the gate electrodes GSL, WL1 to WLn, SSL_L, and SSL_U and each insulating pattern 125 may have a layered structure extending in a first direction Y and a second direction X.

The respective gate electrodes GSL, WL1 to WLn, SSL_L, and SSL_U may be stacked alternately with the respective insulating patterns 125. For example, the plurality of gate electrodes GSL, WL1 to WLn, SSL_L, and SSL_U may be spaced part from one another along a third direction Z and sequentially stacked. At this time, each insulating pattern 125 may be interposed between the plurality of gate electrodes GSL, WL1 to WLn, SSL_L, and SSL_U. That is, the plurality of gate electrodes GSL, WL1 to WLn, SSL_L, and SSL_U may be electrically spaced apart from one another by the respective insulating patterns 125.

As shown in FIG. 1, in some embodiments, a plurality of gate electrodes GSL, WL1 to WLn, SSL_L, and SSL_U may be stacked in a step-like manner. In FIG. 2, although the plurality of gate electrodes GSL, WL1 to WLn, SSL_L, and SSL_U are shown as having the same thickness as one another, e.g., in the third direction Z, this is merely an example. For example, the plurality of gate electrodes GSL, WL1 to WLn, SSL_L, and SSL_U may have different thicknesses from one another.

In some embodiments, the plurality of gate electrodes GSL, WL1 to WLn, SSL_L, and SSL_U may include a ground selection line GSL, a plurality of word lines WL1 to WLn, and a plurality of string selection lines SSL_L and SSL_U. The ground selection line GSL, the plurality of word lines WL1 to WLn, and the plurality of string selection lines SSL_L and SSL_U may be sequentially stacked on the substrate 100.

Although only three word lines are schematically shown between the ground selection line GSL and the string selection lines SSL_L and SSL_U in FIG. 2, this is only for ease of explanation. For example, eight, sixteen, thirty-two, sixty-four or more word lines may be stacked between the ground selection line GSL and the string selection lines SSL_L and SSL_U.

The plurality of string selection lines SSL_L and SSL_U may include a first string selection line SSL_L and a second string selection line SSL_U, which are sequentially stacked on the plurality of word lines WL1 to WLn. For example, the first string selection line SSL_L may be formed on the uppermost word line WLn and may be spaced apart from the uppermost word line WLn by the insulating pattern 125. Also, for example, the second string selection line SSL_U may be formed on the first string selection line SSL_L and spaced apart from the first string selection line SSL_L by the insulating pattern 125.

Each of the gate electrodes GSL, WL1 to WLn, SSL_L, and SSL_U may include a conductive material. For example, each of the gate electrodes GSL, WL1 to WLn, SSL_L and SSL_U may include, but is not limited to, a metal, e.g., tungsten (W), cobalt (Co) and nickel (Ni), or a semiconductor material, e.g., silicon.

Each insulating pattern 125 may include an insulating material. For example, each insulating pattern 125 may include, but is not limited to, silicon oxide.

The mold structure MS may be separated, e.g., into sections, by a first word line cutting region WLC1 and a second word line cutting region WLC2. For example, as shown in FIG. 1, each of the first word line cutting region WLC1 and the second word line cutting region WLC2 may extend along the first direction Y side by side to cut the mold structure MS, e.g., the first and second word line cutting regions WLC1 and WLC2 may extend in the first direction Y in parallel to each other and spaced apart from each other along the second direction X to separate the mold structure MS into discrete sections spaced apart from each other along the second direction X.

In some embodiments, a first cutting structure 150A may be formed in the first word line cutting region WLC1, and a second cutting structure 150B may be formed in the second word line cutting region WLC2. As shown in FIG. 2, the first cutting structure 150A and the second cutting structure 150B may penetrate the, e.g., entire, mold structure MS and extend to the substrate 100. Therefore, each of the first cutting structure 150A and the second cutting structure 150B may extend side by side along the first direction Y to cut the mold structure MS. In some embodiments, each of the first cutting structure 150A and the second cutting structure 150B may include a plug pattern 152 and a spacer 154.

The plug pattern 152 may penetrate the mold structure MS and may be connected to the substrate 100. In some embodiments, the plug pattern 152 may be provided as a common source line (CSL) of a nonvolatile memory device according to some embodiments. For example, the plug pattern 152 may include a conductive material. Also, the plug pattern 152 may be connected to an impurity region 105 in the substrate 100. The impurity region 105 may extend, e.g., in the first direction Y. The same voltage may be electrically applied to the plug pattern 152 of the first cutting structure 150A and the plug pattern 152 of the second cutting structure 150B, or different voltages may be applied thereto and they may be separately controlled.

The spacer 154 may be interposed between the plug pattern 152 and the mold structure MS. For example, the spacer 154 may extend along the side wall of the plug pattern 152. The spacer 154 may include an insulating material. Thus, the plug pattern 152 may be electrically insulated, e.g., spaced apart, from the plurality of gate electrodes GSL, WL1 to WLn, SSL_L, and SSL_U of the mold structure MS.

The plurality of channel structures CS1 to CS6 may penetrate the mold structure MS and may be connected to the substrate 100. For example, each of the channel structures CS1 to CS6 may be in a filler shape extending in the third direction Z. That is, each of the channel structures CS1 to CS6 may extend in a direction intersecting the plurality of gate electrodes GSL, WL1 to WLn, SSL_L, and SSL_U. Also, each of the channel structures CS1 to CS6 may include a semiconductor pattern 130 and an information storage film 132.

The semiconductor pattern 130 may penetrate the mold structure MS and may be connected to the substrate 100. In FIG. 2, the semiconductor pattern 130 is shown as a cup shape, but this is merely an example. For example, the semiconductor pattern 130 may have various shapes, e.g., a cylindrical shape, a square barrel shape, and a solid filler shape. For example, the semiconductor pattern 130 may include a semiconductor material, e.g., single crystal silicon, polycrystalline silicon, an organic semiconductor material, and a carbon nanostructure.

The information storage film 132 may be interposed between the semiconductor pattern 130 and the plurality of gate electrodes GSL, WL1 to WLn, SSL_L, and SSL_U. For example, the information storage film 132 may extend along the side walls of the semiconductor pattern 130. In FIG. 2, although the information storage film 132 is shown as extending continuously along the side walls of the semiconductor pattern 130, this is merely an example. For example, the information storage film 132 may extend discontinuously on the side walls of the semiconductor pattern 130. In some embodiments, the information storage film 132 may extend along the upper surfaces and/or the lower surfaces of the respective gate electrodes GSL, WL1 to WLn, SSL_L and SSL_U.

The information storage film 132 may include, e.g., at least one of silicon oxide, silicon nitride, silicon oxynitride, and a high-k material having a dielectric constant higher than that of silicon oxide. The high-k material may include, e.g., at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may include a plurality of films. For example, as shown in FIG. 3, the information storage film 132 may include a tunnel insulating film 132a, a charge storage film 132b, and a blocking insulating film 132c which are sequentially stacked on the semiconductor pattern 130. The tunnel insulating film 132a may include, e.g., silicon oxide or a high-k material (e.g., aluminum oxide ($Al_2O_3$) and hafnium oxide ($HfO_2$)). The charge storage film 132b may include, e.g., silicon nitride. The blocking insulating film 132c may include, e.g., silicon oxide or a high-k material (e.g., aluminum oxide ($Al_2O_3$) and hafnium oxide ($HfO_2$)).

As further illustrated in FIG. 2, in some embodiments, each of the channel structures CS1 to CS6 may further include a filled insulating pattern 134. The filled insulating pattern 134 may be formed to fill the inside of the cup-shaped semiconductor pattern 130. Thus, the semiconductor pattern 130 may extend conformally along the side walls and the bottom surface of the filled insulating pattern 134. The filled insulating pattern 134 may include, e.g., silicon oxide.

In some embodiments, each of the channel structures CS1 to CS6 may further include a channel pad 136. The channel pad 136 may be formed to be connected to the upper part of the semiconductor pattern 130. For example, the channel pad 136 may be formed in the first interlayer insulating film 140 formed on the mold structure MS.

In FIG. 2, although the channel pad 136 is shown as being formed on the upper surface of the semiconductor pattern 130, this is merely an example. For example, the upper part of the semiconductor pattern 130 may be formed to extend along the side walls of the channel pad 136. The channel pad 136 may include, e.g., impurity-doped polysilicon.

In some embodiments, the plurality of channel structures CS1 to CS6 may include first to sixth channel structures CS1 to CS6 which are sequentially arranged along the second direction X between the first word line cutting region WLC1 and the second word line cutting region WLC2. Hereinafter, although the first to sixth channel structures CS1 to CS6 will be described as being arranged in a zigzag form along the second direction X, this is merely an example, and the present disclosure is not limited thereto. For example, the first to sixth channel structures CS1 to CS6 may be arranged in a row along the second direction X.

Each of the plurality of cutting lines SS1 and SS2 may be disposed in the mold structure MS to cut the plurality of string selection lines SSL_L and SSL_U. In some embodiments, the plurality of cutting lines SS1 and SS2 may be formed in the same number as that of the plurality of string selection lines SSL_L and SSL_U. For example, when the number of the plurality of string selection lines SSL_L and SSL_U stacked on the plurality of word lines WL1 to WLn is n (here, n is a natural number of 2 or more), the plurality of cutting lines SS1 and SS2 may be formed in the number of n. For example, when two string selection lines (the first and second string selection lines SSL_L and SSL_U) are formed on the mold structure MS, two cutting lines (the first and second cutting lines SS1 and SS2) may be formed.

A first cutting line SS1 may be interposed between the first word line cutting region WLC1 and the second word line cutting region WLC2. Also, the first cutting line SS1 may cut the first string selection line SSL_L, e.g., the first cutting line SS1 may extend in the third direction Z through an entirety of the first string selection line SSL_L and the insulating pattern 125 underneath the first string selection line SSL_L (FIG. 4a). That is, the first cutting line SS1 may separate the first string selection line SSL_L, which is already separated into sections by the first word line cutting region WLC1 and the second word line cutting region WLC2 again.

For example, as shown in FIG. 1, the first string selection line SSL_L may include a first substring selection line SSL_La and a second substring selection line SSL_Lb separated by the first cutting line SS1. The first substring selection line SSL_La may be a region of the first string selection line SSL_L between, e.g., separated by, the first cutting line SS1 and the first word line cutting region WLC1, and the second substring selection line SSL_Lb may be a region of the first string selection line SSL_L between, e.g., separated by, the first cutting line SS1 and the second word line cutting region WLC2.

However, the first cutting line SS1 may not cut the second string selection line SSL_U. For example, as shown in FIG. 2, the upper surface of the first cutting line SS1 may be formed to be lower than the bottom surface of the second string selection line SSL_U.

A plurality of channel structures may be disposed between the first cutting line SS1 and the first word line cutting region WLC1, and between the first cutting line SS1 and the second word line cutting region WLC2. For example, as shown in FIGS. 1 and 2, first to fourth channel structures CS1 to CS4 may be disposed between the first cutting line SS1 and the first word line cutting region WLC1, and fifth and sixth channel structures CS5 and CS6 may be disposed between the first cutting line SS1 and the second word line cutting region WLC2. Thus, the first to fourth channel structures CS1 to CS4 may intersect the first substring selection line SSL_La, and the fifth and sixth channel structures CS5 and CS6 may intersect the second substring selection line SSL_Lb.

In some embodiments, the first cutting line SS1 may extend in parallel with the first word line cutting region WLC1 and the second word line cutting region WLC2. For example, the first cutting line SS1 may extend in the first direction Y. For example, referring to FIG. 1, the first cutting line SS1 may extend in the first direction Y through an entire length of the first string selection line SSL_L in the second direction Y, while a length of the first cutting line SS1 in the first direction Y may be shorter than that of the first word line cutting region WLC1, e.g., due to a shorter length of the first string selection line SSL_L in the first direction Y relative to the gate electrodes GSL. However, the present disclosure is not limited thereto, and the first cutting line SS1 may extend in another direction intersecting the first direction Y. For example, unlike the shown case, the first cutting line SS1 may extend in the second direction X.

The second cutting line SS2 may be interposed between the first word line cutting region WLC1 and the second word line cutting region WLC2. Also, the second cutting line SS2 may cut the second string selection line SSL_U, e.g., the second cutting line SS2 may extend in the third direction Z through an entirety of the second string selection line SSL_U and the insulating pattern 125 underneath the second string selection line SSL_U. That is, the second cutting line SS2 may separate the second string selection line SSL_U, which is already separated into sections by the first word line cutting region WLC1 and the second word line cutting region WLC2.

For example, as shown in FIG. 1, the second string selection line SSL_U may include a third substring selection line SSL_Ua and a fourth substring selection line SSL_Ub separated by the second cutting line SS2. The third substring selection line SSL_Ua may be a region of the second string selection line SSL_U between, e.g., separated by, the second cutting line SS2 and the first word line cutting region WLC1, and the fourth substring selection line SSL_Ub may be a region of the second string selection line SSL_U between, e.g., separated by, the second cutting line SS2 and the second word line cutting region WLC2.

In some embodiments, the second cutting line SS2 may extend in parallel with the first word line cutting region WLC1 and the second word line cutting region WLC2. For example, the second cutting line SS2 may extend in the first direction Y. For example, referring to FIG. 1, the second cutting line SS2 may extend in the first direction Y through an entire length of the second string selection line SSL_U in the second direction Y, while a length of the second cutting line SS2 in the first direction Y may be shorter than that of the first cutting line SS1, e.g., due to a shorter length of the second string selection line SSL_U in the first direction Y relative to the first string selection line SSL_L. However, the present disclosure is not limited thereto, and the second cutting line SS2 may extend in another direction intersecting the first direction Y. For example, unlike the shown case, the second cutting line SS2 may extend in the second direction X.

In a plan view, the second cutting line SS2 may be spaced apart from the first cutting line SS1. For example, as shown in FIG. 1, the second cutting line SS2 may be spaced apart from the first cutting line SS1 in the second direction X. In another example, if each of the first cutting line SS1 and the second cutting line SS2 extends in the second direction X, the second cutting line SS2 may be spaced apart from the first cutting line SS1 in the first direction Y.

In some embodiments, the first cutting line SS1 and the second cutting line SS2 may not overlap each other in a plan view. For example, the first cutting line SS1 and the second cutting line SS2 may extend side by side, e.g., in parallel, along the first direction Y.

However, the second cutting line SS2 may not cut the first string selection line SSL_L. For example, as shown in FIG. 2, the bottom surface of the second cutting line SS2 may be disposed on the same plane as the upper surface of the first string selection line SSL_L. That is, in the nonvolatile memory device according to some embodiments, none of the string selection lines is cut by a plurality of cutting lines. For example, the first string selection line SSL_L may be cut only by a single cutting line (the first cutting line SS1), and the second string selection line SSL_U may also be cut only by a single cutting line (the second cutting line SS2).

The first cutting line SS1 and the second cutting line SS2 may include an insulating material. For example, each of the first cutting line SS1 and the second cutting line SS2 may include at least one of silicon oxide, silicon nitride and silicon oxynitride. In some embodiments, the first cutting line SS1 and the second cutting line SS2 may include the same insulating material as each other.

A plurality of channel structures may be disposed between the second cutting line SS2 and the first word line cutting region WLC1, and between the second cutting line SS2 and the second word line cutting region WLC2. For example, as shown in FIGS. 1 and 2, the first and second channel structures CS1 and CS2 may be disposed between the second cutting line SS2 and the first word line cutting region WLC1, and the third to sixth channel structures CS3 to CS6 may be disposed between the second cutting line SS2 and the second word line cutting region WLC2. Thus, the first and second channel structures CS1 and CS2 may intersect the third substring selection line SSL_Ua, and the third to sixth channel structures CS3 to CS6 may intersect the fourth substring selection line SSL_Ub.

At least some of the plurality of channel structures CS1 to CS6 may be interposed between the first cutting line SS1 and the second cutting line SS2. For example, the third and fourth channel structures CS3 and CS4 may be interposed between the first cutting line SS1 and the second cutting line SS2. Consequentially, the first and second channel structures CS1 and CS2 may intersect the first and third substring selection lines SSL_La and SSL_Ua. The third and fourth channel structures CS3 and CS4 may intersect the first and fourth substring selection lines SSL_La and SSL_Ub. The fifth and sixth channel structures CS5 and CS6 may intersect the second and fourth substring selection lines SSL_Lb and SSL_Ub.

In some embodiments, the second cutting line SS2 may extend in parallel with the first word line cutting region WLC1 and the second word line cutting region WLC2. For example, the second cutting line SS2 may extend in the first direction Y. However, the present disclosure is not limited thereto, and the second cutting line SS2 may extend in another direction intersecting the first direction Y.

When the number of the plurality of cutting lines SS1 and SS2 is n (here, n is a natural number of 2 or more), (n+1) or more channel structures X spaced apart from each other by the plurality of cutting lines SS1 and SS2 may be arranged in a row along the second direction X. For example, when the two cutting lines (the first and second cutting lines SS1 and SS2) are formed, three channel structures (the first, third and fifth channel structures CS1, CS3 and CS5) spaced apart from one another by the first and second cutting lines SS1 and SS2 may be arranged in a row along the second direction X. Or, the other three channel structures (the second, fourth and sixth channel structures CS2, CS4 and CS6) spaced apart from one another by the first and second cutting lines SS1 and SS2 may be arranged in a row along the second direction X.

The plurality of bit lines BL1 and BL2 may be connected to the plurality of channel structures CS1 to CS6. For example, each of the bit lines BL1 and BL2 may be connected to each of the channel structures CS1 to CS6 through a bit line contact 170. The bit line contact 170 penetrates, e.g., a second interlayer insulating film 160 on the mold structure MS, and may electrically connect the respective channel structures CS1 to CS6 and the respective bit lines BL1 and BL2.

In some embodiments, the plurality of bit lines BL and BL2 may intersect the first cutting line SS1 and the second cutting line SS2. For example, the plurality of bit lines BL1 and BL2 may extend in the second direction X.

In some embodiments, each of the bit lines BL1 and BL2 may be connected with a plurality of channel structures arranged in a row. For example, the first bit line BL1 may be connected to the first, third and fifth channel structures CS1, CS3 and CS5, and the second bit line BL2 may be connected to the second, fourth and sixth channel structures CS2, CS4 and CS6.

In some embodiments, the plurality of bit lines BL1 and BL2 may extend side by side, e.g., in parallel, at equal intervals. For example, the first and second bit lines BL1 and BL2 may be spaced apart from each other at a first pitch P1, and may extend side by side along the second direction X.

As the degree of integration of nonvolatile memory device increases, the pitch between the bit lines gradually decreases. For example, as more and more channel structures are disposed in a mold structure that is cut by the word line cutting region, more bit lines may be required to separately control each of the channel structures. However, the pitch between the narrowing bit lines may increase the process difficulty and cause deterioration of the product reliability.

In contrast, the nonvolatile memory device according to some embodiments may improve the degree of integration of the nonvolatile memory device, without reducing the pitch between the bit lines. For example, the respective channel structures CS1 to CS6 of FIG. 1 may be selected and controlled separately from one another.

In detail, the first channel structure CS1 may be selected by the first bit line BL1 and the first and third substring selection lines SSL_La and SSL_Ua. The second channel structure CS2 may be selected by the second bit line BL2 and the first and third substring selection lines SSL_La and SSL_Ua. The third channel structure CS3 may be selected by the first bit line BL1 and the first and fourth substring selection lines SSL_La and SSL_Ub. The fourth channel structure CS4 may be selected by the second bit line BL2 and the first and fourth substring selection lines SSL_La and SSL_Ub. The fifth channel structure CS5 may be selected by the first bit line BL1 and the second and fourth substring selection lines SSL_Lb and SSL_Ub. The sixth channel structure CS6 may be selected by the second bit line BL2 and the second and fourth substring selection lines SSL_Lb and SSL_Ub.

However, if the first cutting line SS1 were not disposed, an additional bit line for separately controlling the first channel structure CS1 and the third channel structure CS3 would have been required. Also, if the second cutting line SS2 were not disposed, an additional bit line for separately controlling the third channel structure CS3 and the fifth channel structure CS5 would have been required. That is, according to some embodiments, it is possible to provide a nonvolatile memory device with improved degree of integration, using a plurality of string selection lines (e.g., the first and second string selection lines SSL_L and SSL_U) and a plurality of cutting lines (e.g., the first and second cutting lines SS1 and SS2).

Various shapes of the first cutting line SS1 and the second cutting line SS2 according to some embodiments of the present disclosure will be described below with reference to FIGS. 4a to 4d. Although FIGS. 4a to 4d only show the first cutting line SS1, the second cutting line SS2 may have a similar shape.

In some embodiments, a bottom surface of the first cutting line SS1 may be formed to be lower than a bottom surface of the first string selection line SSL_L. For example, as described previously with reference to FIGS. 2 and 4a, the first cutting line SS1 may penetrate through the entire insulating pattern 125 disposed under the first string selection line SSL_L. Thus, in some embodiments, the bottom surface of the first cutting line SS1 may come into contact with an upper surface of a gate electrode (e.g., a word line WLn) disposed under the first string selection line SSL_L.

Figure 4B:
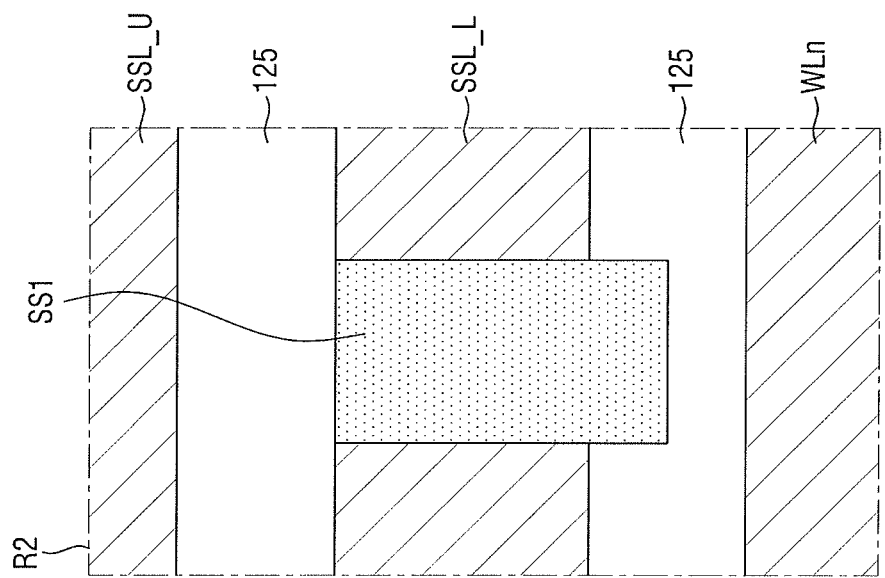

In some embodiments, the bottom surface of the first cutting line SS1 may be formed to be higher than a bottom surface of the insulating pattern 125 disposed under the first string selection line SSL_L. For example, as shown in FIG. 4b, a lower part of the first cutting line SS1 may be buried in the insulating pattern 125 disposed under the first string selection line SSL_L. Thus, in some embodiments, the bottom surface of the first cutting line SS1 may not be in contact with an upper surface of a gate electrode (e.g., a word line WLn) disposed under the first string selection line SSL_L.

Figure 4C:
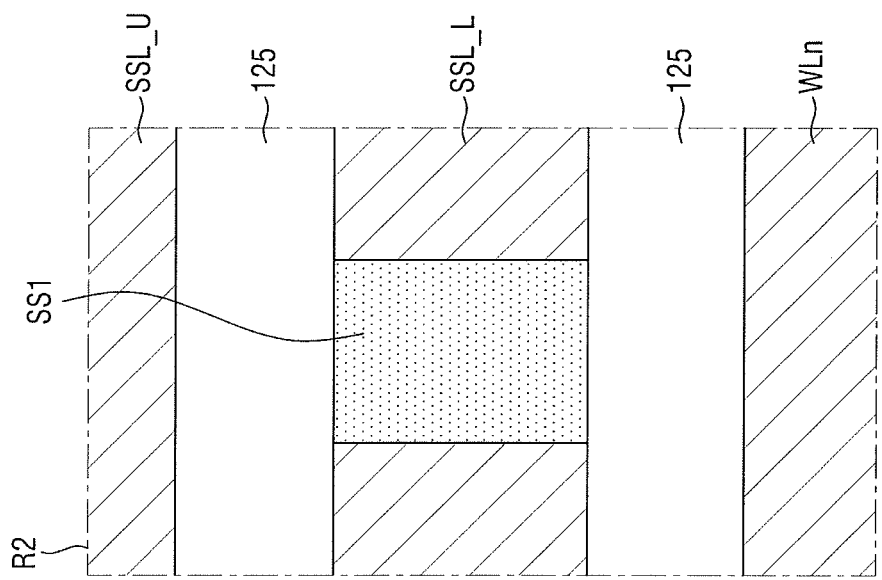

In some embodiments, the bottom surface of the first cutting line SS1 may be disposed on the same plane as the bottom surface of the first string selection line SSL_L. In the present specification, the term "same" means not only completely the same but also fine differences that may occur due to process margins and the like. For example, as shown in FIG. 4c, the bottom surface of the first cutting line SS1 may be in contact with the upper surface of the insulating pattern 125 disposed under the first string selection line SSL_L.

Figure 4D:
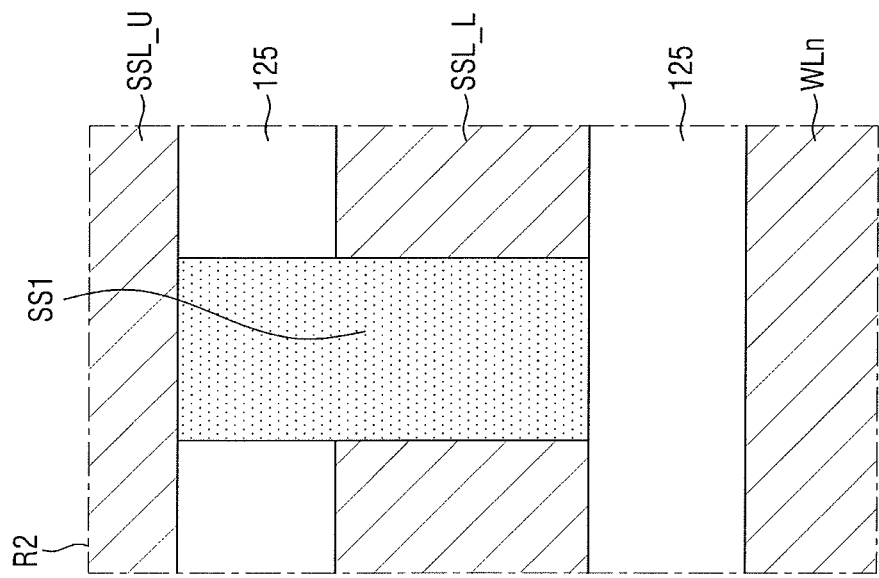

In some embodiments, the upper surface of the first cutting line SS1 may be formed to be higher than the upper surface of the first string selection line SSL_L. For example, as shown in FIG. 4d, the first cutting line SS1 may penetrate the insulating pattern 125 disposed on the first string selection line SSL_L. Accordingly, in some embodiments, the upper surface of the first cutting line SS1 may be in contact with the upper surface of a gate electrode (e.g., a second string selection line SSL_U) disposed on the first string selection line SSL_L.

Figure 5:
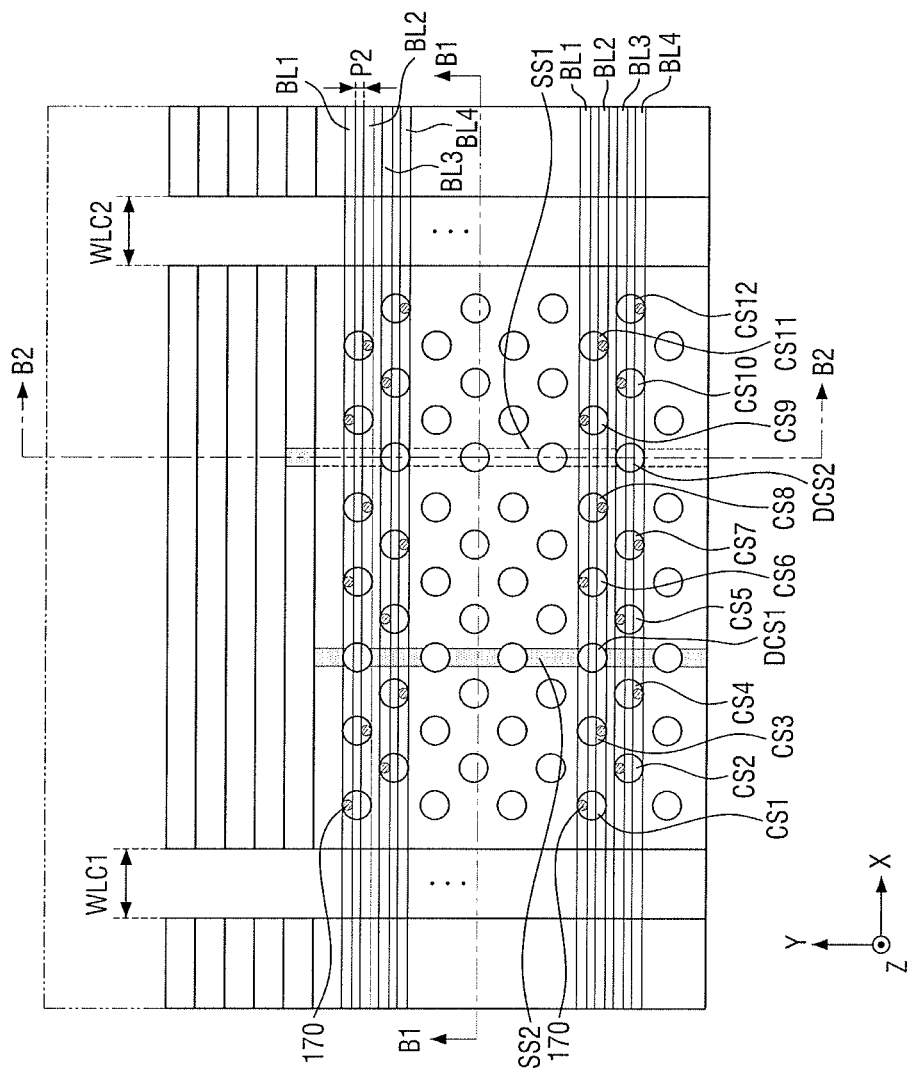
FIG. 5 illustrates a layout view of a nonvolatile memory device according to some embodiments.
Figure 6:
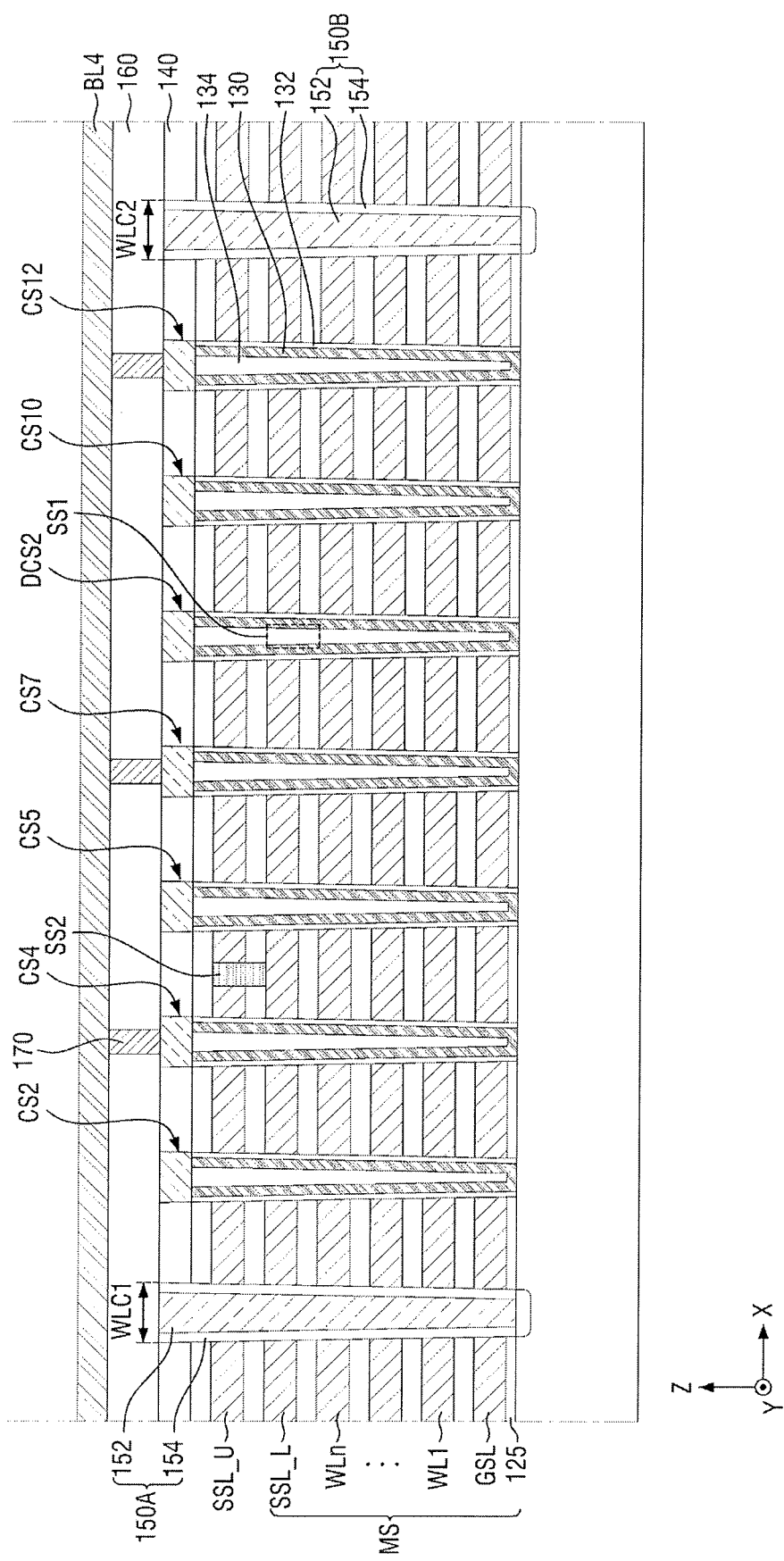
FIG. 6 illustrates a cross-sectional view taken along line B1-B1 of FIG. 5.
Figure 7:
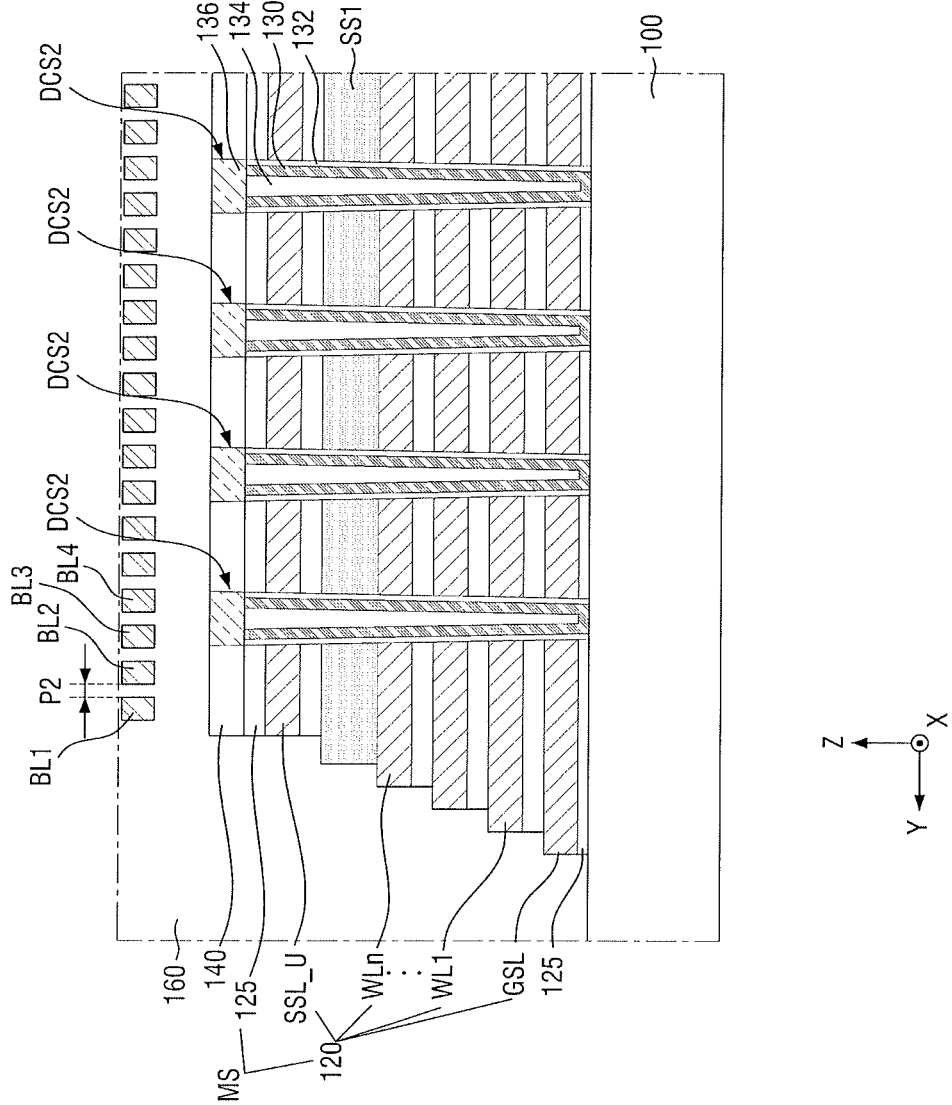
FIG. 7 illustrates a cross-sectional view taken along line B2-B2 of FIG. 5.

FIG. 5 is a layout view for explaining a nonvolatile memory device according to some embodiments of the present disclosure. FIG. 6 is a cross-sectional view taken along line B1-B1 of FIG. 5. FIG. 7 is a cross-sectional view taken along line B2-B2 of FIG. 5. For the convenience of description, repeated parts of those described using FIGS. 1 to 4d will be only briefly described or omitted.

Referring to FIGS. 5 to 7, the nonvolatile memory device according to some embodiments may further include dummy channel structures DCS1 and DCS2.

The dummy channel structures DCS1 and DCS2 may penetrate the mold structure MS and may be connected to the substrate 100. In some embodiments, the dummy channel structures DCS1 and DCS2 may have the same shape as those of the plurality of channel structures CS1 to CS12. For example, the dummy channel structures DCS1 and DCS2 may have a filler shape extending in the third direction Z. In addition, the dummy channel structure DCS1 and DCS2 may include the semiconductor pattern 130 and the information storage film 132.

In some embodiments, the dummy channel structures DCS1 and DCS2 may cross the first cutting line SS1 and/or the second cutting line SS2. For example, as shown in FIGS. 5 and 7, the dummy channel structures DCS1 and DCS2 may include a first dummy channel structure DCS1 crossing the second cutting line SS2, and a second dummy channel structure DCS2 crossing the first cutting line SS1.

Although each of the two dummy channel structures DCS1 and DCS2 is shown as crossing the first and second cutting lines SS1 and SS2, this is merely an example, and the present disclosure is not limited thereto. For example, one of the first dummy channel structure DCS1 and the second dummy channel structure DCS2 may be omitted.

In some embodiments, twelve or more channel structures CS1 to CS12 arranged along the second direction X may be arranged between the first word line cutting region WLC1 and the second word line cutting region WLC2. For example, the first to fourth channel structures CS1 to CS4, the first dummy channel structure DCS1, the fifth to eighth channel structures CS5 to CS8, the second dummy channel structure DCS2, and the ninth to twelfth channel structures CS9 to CS12 may be sequentially arranged between the first word line cutting region WLC1 and the second word line cutting region WLC2. That is, a total of fourteen channel structures CS1 to CS12 and dummy channel structures DCS1 and DCS2 may be arranged along the second direction X between the first word line cutting region WLC1 and the second word line cutting region WLC2. Although the channel structures CS1 to CS12 and the dummy channel structures DCS1 and DCS2 are illustrated in FIG. 5 as being arranged in a zigzag form along the second direction X, this is merely an example, and the present disclosure is not limited thereto.

As the number of channel structures CS1 to CS12 between the first word line cutting region WLC1 and the second word line cutting region WLC2 increases, the number of required bit lines on the channel structures CS1 to CS12 also increases. For example, the number of the bit lines BL1 to BL4 of FIG. 5 is larger than that of the bit lines BL1 and BL2 of FIG. 1.

In some embodiments, each of the bit lines BL1 to BL4 may be connected to a plurality of channel structures CS1 to CS12 arranged in a row. For example, the first bit line BL1 may be connected to the first, sixth and ninth channel structures CS1, CS6 and CS9. The second bit line BL2 may be connected to the third, eighth and eleventh channel structures CS3, CS8 and CS11. The third bit line BL3 may be connected to the second, fifth and tenth channel structures CS2, CS5 and CS10. The fourth bit line BL4 may be connected to the fourth, seventh and twelfth channel structures CS4, CS7 and CS12.

In some embodiments, the dummy channel structures DCS1 and DCS2 may not be connected to the plurality of bit lines BL1 to BL4. For example, a bit line contact 170 may not be formed on the dummy channel structures DCS1 and DCS2.

In some embodiments, the plurality of bit lines BL1 to BL4 may extend side by side at equal intervals. For example, the first to fourth bit lines BL1 to BL4 may be spaced apart from each other at a second pitch P2, and may extend side by side along the second direction X. In some embodiments, the second pitch P2 of FIG. 5 may be smaller than the first pitch P1 of FIG. 1.

Figure 8:
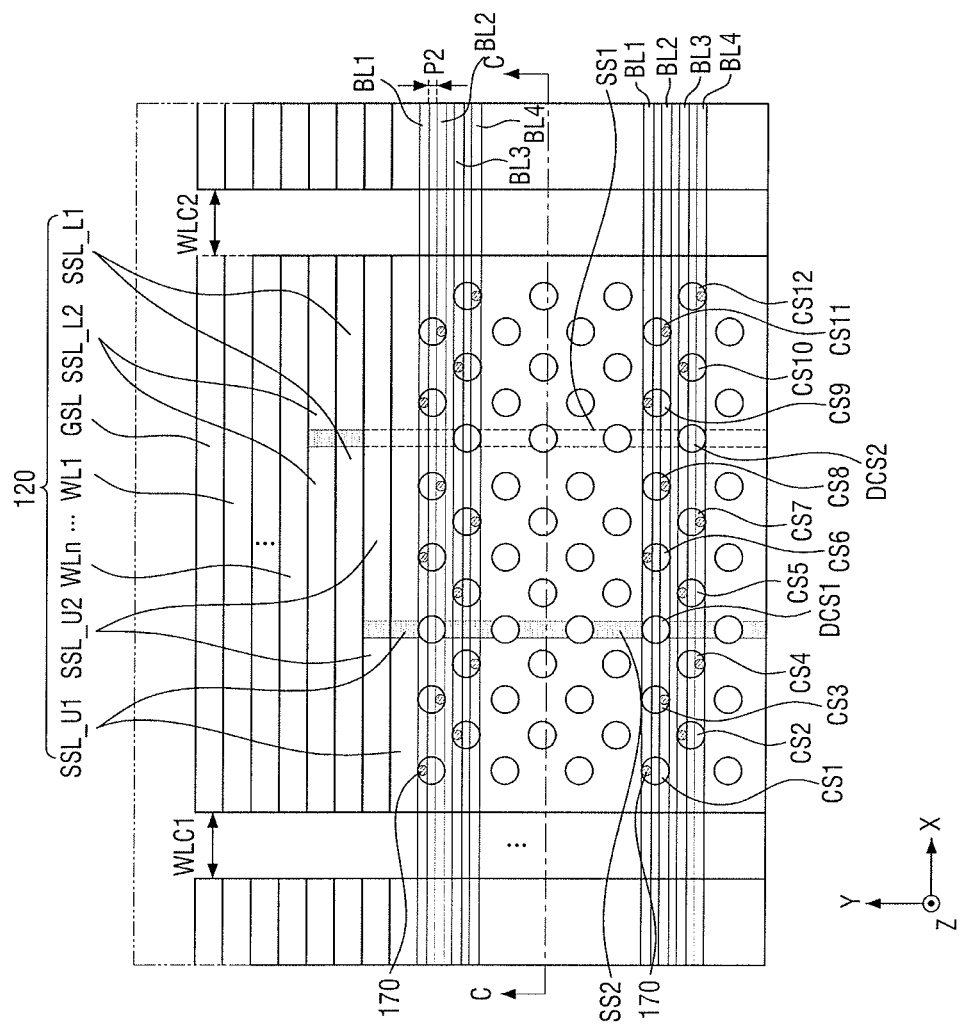
FIG. 8 illustrates a layout view of a nonvolatile memory device according to some embodiments.
Figure 9:
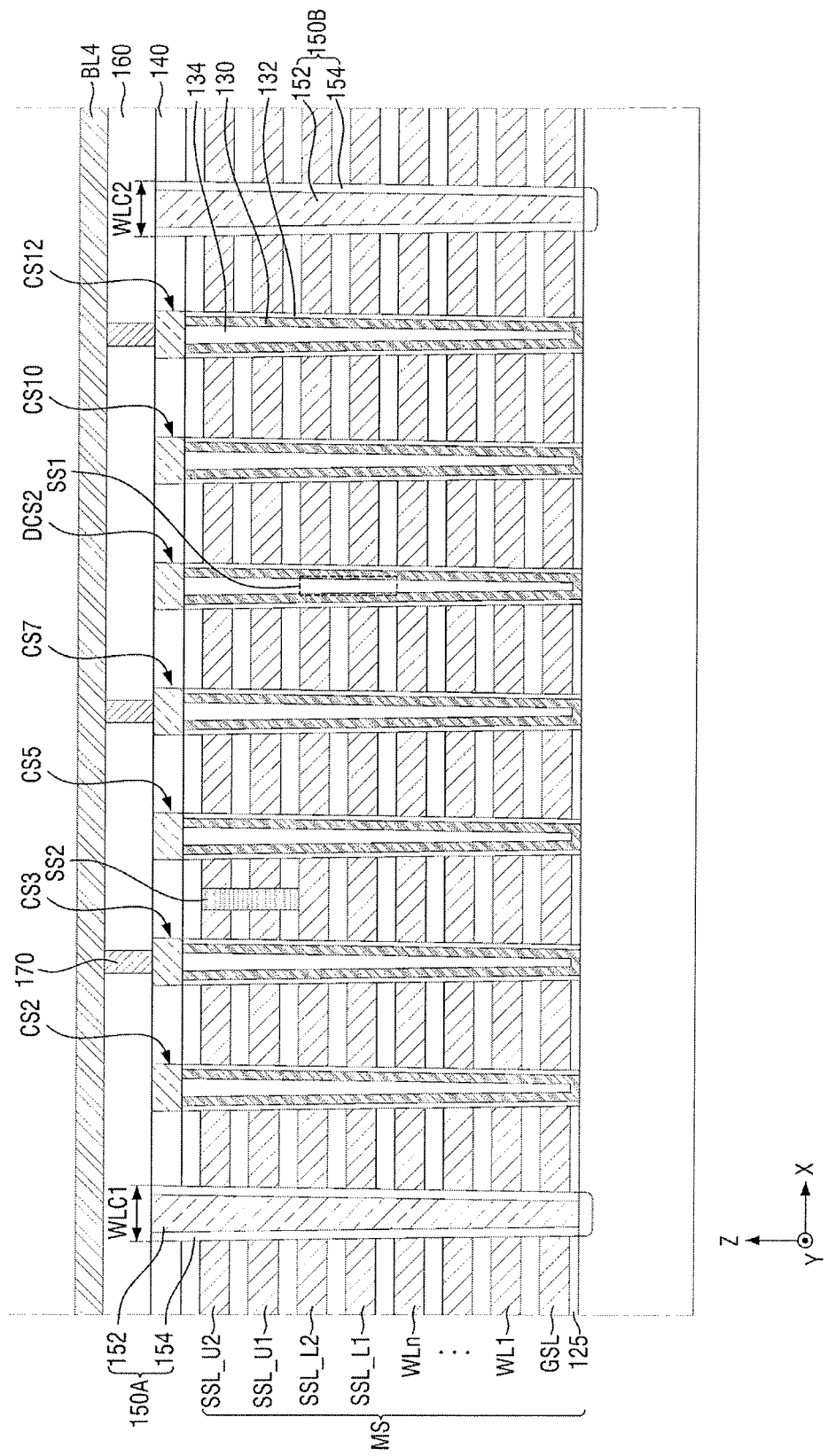
FIG. 9 illustrates a cross-sectional view taken along line C-C of FIG. 8.

FIG. 8 is a layout view of a nonvolatile memory device according to some embodiments of the present disclosure. FIG. 9 is a cross-sectional view taken along line C-C of FIG. 8. For the convenience of description, repeated parts of those described using FIGS. 1 to 7 will be only briefly described or omitted.

Referring to FIGS. 8 and 9, in the nonvolatile memory device according to some embodiments, the first cutting line SS1 and/or the second cutting line SS2 cut a plurality of string selection lines.

For example, the first string selection line SSL_L may include a first lower string selection line SSL_L1 and a first upper string selection line SSL_L2. The first lower string selection line SSL_L1 may be formed on the uppermost word line WLn, and may be spaced apart from the uppermost word line WLn by the insulating pattern 125. The first upper string selection line SSL_L2 may be formed on the first lower string selection line SSL_L1 and may be spaced apart from the first lower string selection line SSL_L1 by the insulating pattern 125. At this time, the first cutting line SS1 may cut both the first lower string selection line SSL_L1 and the first upper string selection line SSL_L2.

Also, for example, the second string selection line SSL_U may include a second lower string selection line SSL_U1 and a second upper string selection line SSL_U2. The second lower string selection line SSL_U1 may be formed on the first upper string selection line SSL_L2, and may be spaced apart from the first upper string selection line SSL_L2 by the insulating pattern 125. The second upper string selection line SSL_U2 may be formed on the second lower string selection line SSL_U1, and may be spaced apart from the second lower string selection line SSL_U1 by the insulating pattern 125. At this time, the second cutting line SS2 may cut both the second lower string selection line SSL_U1 and the second upper string selection line SSL_U2.

Although each of the first cutting line SS1 and/or the second cutting line SS2 is shown as cutting only two string selection lines, this is only for convenience of explanation. For example, the first cutting line SS1 and/or the second cutting line SS2 may also cut three or more string selection lines, respectively.

Also, although both the first cutting line SS1 and the second cutting line SS2 are shown as cutting the two string cutting selection lines, respectively, this is merely an example. For example, one of the first cutting line SS1 and the second cutting line SS2 may cut only one string selection line.

Figure 10:
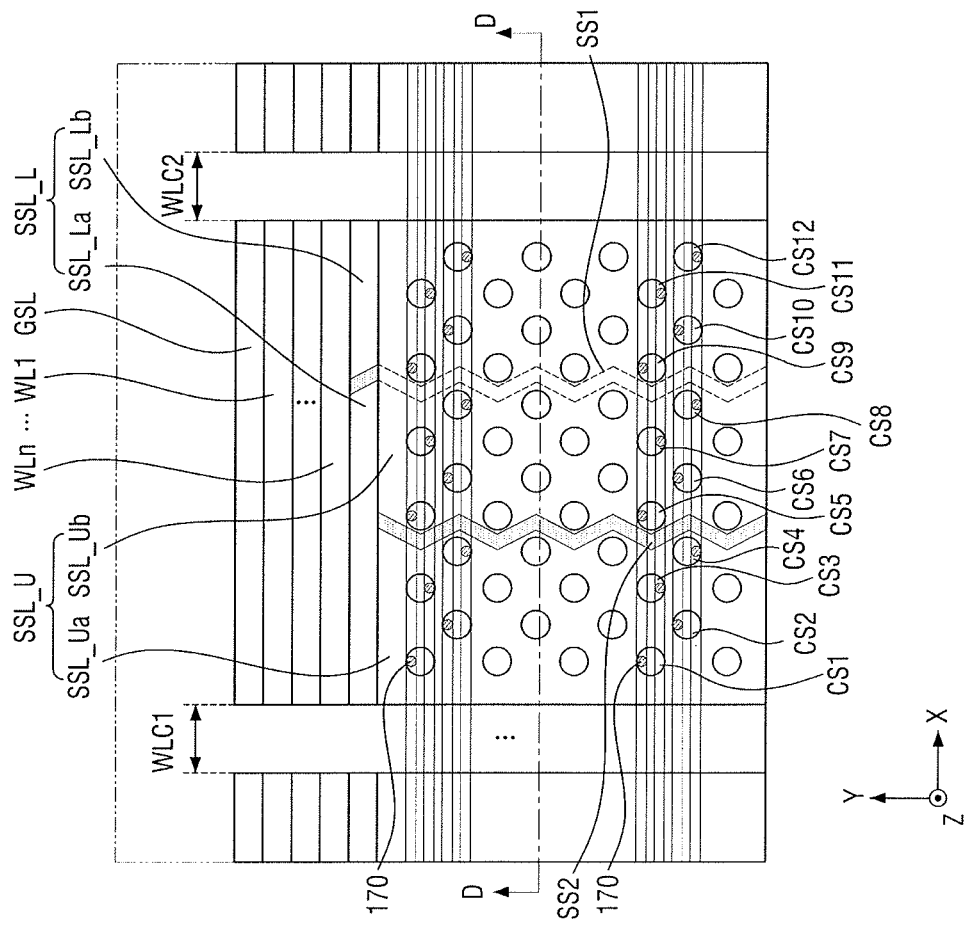
FIG. 10 illustrates a layout diagram of a nonvolatile memory device according to some embodiments.
Figure 11:
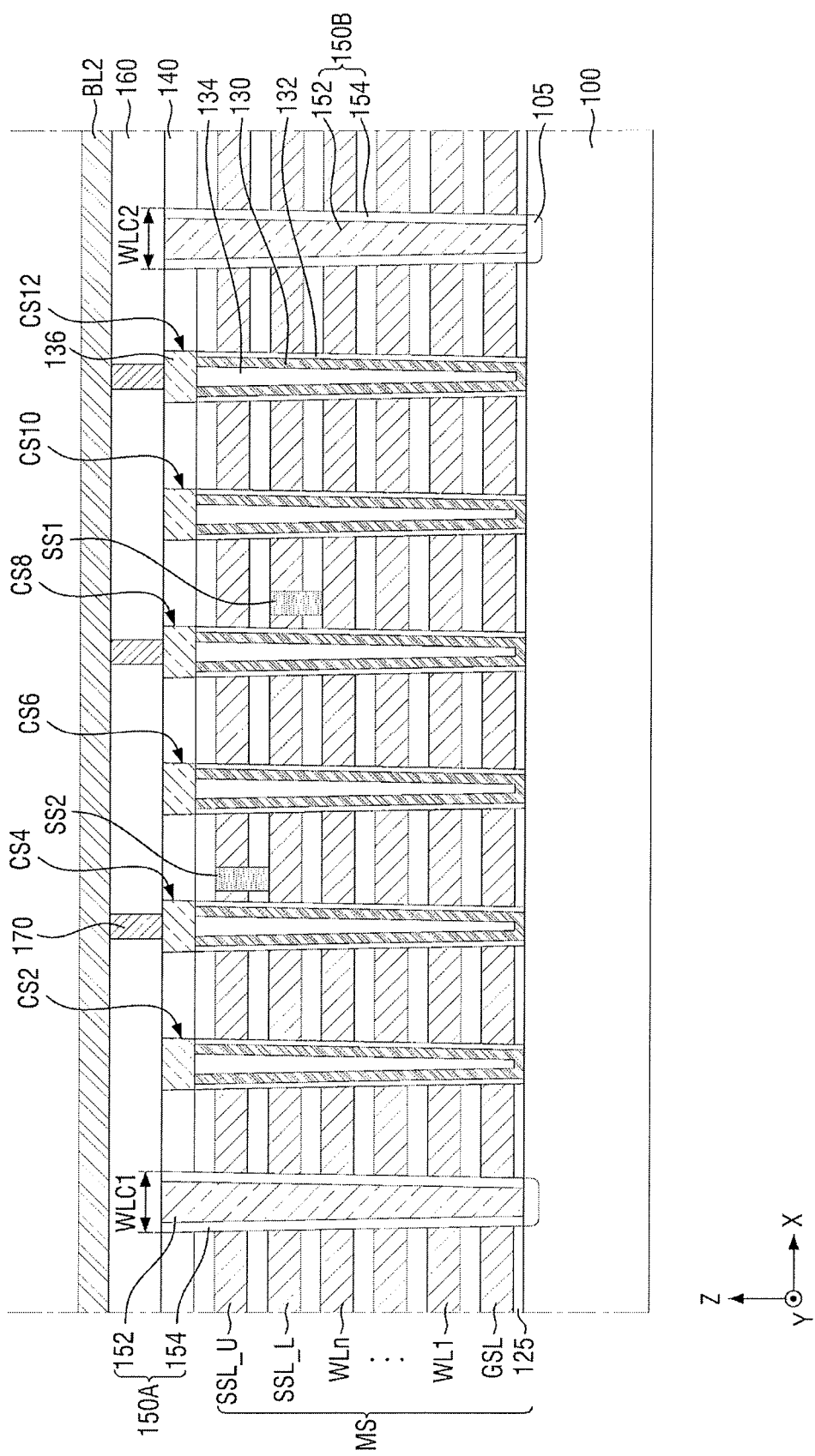
FIG. 11 illustrates a cross-sectional view taken along line D-D of FIG. 10.

FIG. 10 is a layout diagram of a nonvolatile memory device according to some embodiments of the present disclosure. FIG. 11 is a cross-sectional view taken along line D-D of FIG. 10. For convenience of description, repeated parts of those described using FIGS. 1 to 7 will be only briefly described or omitted.

Referring to FIGS. 10 and 11, in the nonvolatile memory device according to some embodiments, the first cutting line SS1 and/or the second cutting line SS2 may have a zigzag shape in a plan view. For example, in a top view, the first cutting line SS1 and/or the second cutting line SS2 may include a shape of a plurality of connected segments that turn from side to side along the first direction Y to define the zigzag shape.

For example, as shown in FIG. 10, the first cutting line SS1 may cross the part between the fourth channel structure CS4 and the fifth channel structure CS5 in a zigzag shape. Also, for example, the second cutting line SS2 may cross the part between the eighth channel structure CS8 and the ninth channel structure CS9 in a zigzag shape. In some embodiments, the first cutting line SS1 and/or the second cutting line SS2 may extend along the first direction Y in a zigzag form.

Although both the first cutting line SS1 and the second cutting line SS2 are shown in the zigzag form in a plan view, this is merely an example. For example, either the first cutting line SS1 or the second cutting line SS2 may extend in a straight line form along the first direction Y.

In this embodiment, since a dummy channel structure is not formed between the first word line cutting region WLC1 and the second word line cutting region WLC2, the nonvolatile memory device having a further improved degree of integration can be provided.

Figure 12:
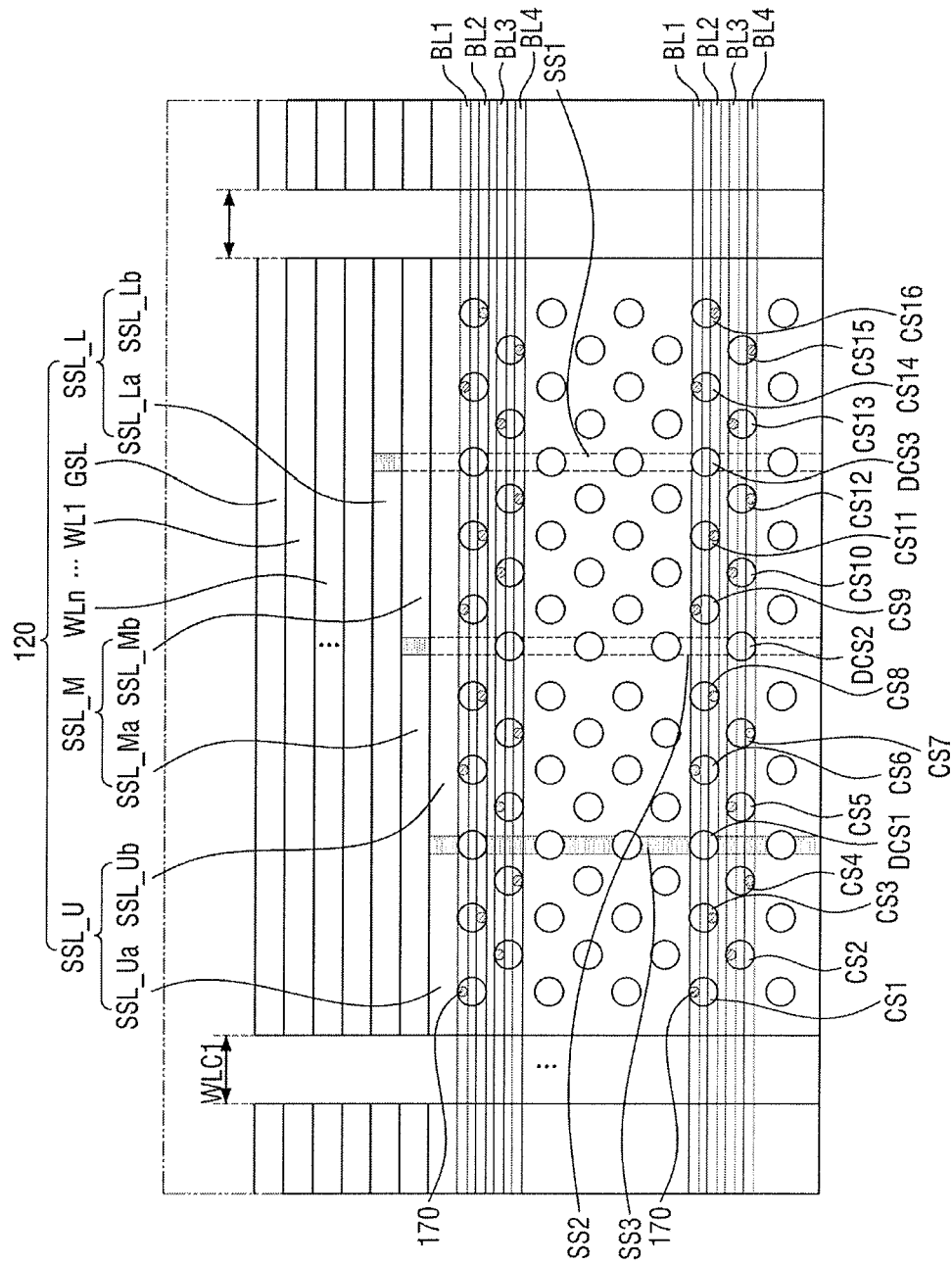
FIG. 12 illustrates a layout view of a nonvolatile memory device according to some embodiments.

FIG. 12 is a layout view of a nonvolatile memory device according to some embodiments of the present disclosure. For the convenience of description, repeated parts of those described using FIGS. 1 to 7 will be only briefly described or omitted.

Referring to FIG. 12, the nonvolatile memory device according to some embodiments may further include a third string selection line SSL_M and a third cutting line SS3.

The third string selection line SSL_M may be interposed, e.g., between the first string selection line SSL_L and the second string selection line SSL_U. Also, the third string selection line SSL_M may be spaced apart from the first string selection line SSL_L and the second string selection line SSL_U by the insulating pattern 125.

The third cutting line SS3 may be interposed between the first word line cutting region WLC1 and the second word line cutting region WLC2. Also, the third cutting line SS3 may cut the third string selection line SSL_M.

For example, the third string selection line SSL_M may include a fifth substring selection line SSL_Ma and a sixth substring selection line SSL_Mb separated by the third cutting line SS3. The fifth substring selection line SSL_Ma may be a region of the third string selection line SSL_M separated by the third cutting line SS3 and the first word line cutting region WLC1, and the sixth substring selection line SSL_Mb may be a region of the third string selection line SSL_M separated by the third cutting line SS3 and the second word line cutting region WLC2.

In some embodiments, the dummy channel structures DCS1 to DCS3 may cross the first to third cutting lines SS1 to SS3. For example, the first dummy channel structure DCS1 may cross the second cutting line SS2, the second dummy channel structure DCS2 may cross the third cutting line SS3, and the third dummy channel structure DCS3 may cross the first cutting line SS1.

In some embodiments, the plurality of channel structures CS1 to CS16 may be selected and controlled independently of one another. For example, the first channel structure CS1 may be selected by the first bit line BL1 and the first, fifth, and third substring selection lines SSL_La, SSL_Ma, and SSL_Ua. For example, the fifth channel structure CS5 may be selected by the third bit line BL3 and the first, fifth, and fourth substring selection lines SSL_La, SSL_Ma, and SSL_Ub. For example, the eleventh channel structure CS11 may be selected by the second bit line BL2 and the first, sixth and fourth substring selection lines SSL_La, SSL_Mb and SSL_Ub. For example, the fifteenth channel structure CS15 may be selected by the fourth bit line BL4 and the second, sixth and fourth substring selection lines SSL_Lb, SSL_Mb and SSL_Ub. In the present embodiment, since additional string selection lines and additional cutting lines are formed, a large number of channel structures may be provided between the first word line cutting region WLC1 and the second word line cutting region WLC2.

Hereinafter, a method for fabricating a nonvolatile memory device according to some embodiments of the present disclosure will be described with reference to FIGS. 1 to 4d and 13 to 22.

FIGS. 13 to 22 are views of stages in a method for fabricating the nonvolatile memory device according to some embodiments of the present disclosure. For convenience of description, repeated parts of those described with reference to FIGS. 1 to 4d will be only briefly described or omitted. For reference, FIGS. 13 to 22 are cross-sectional views corresponding to line A-A of FIG. 1.

Figure 13:
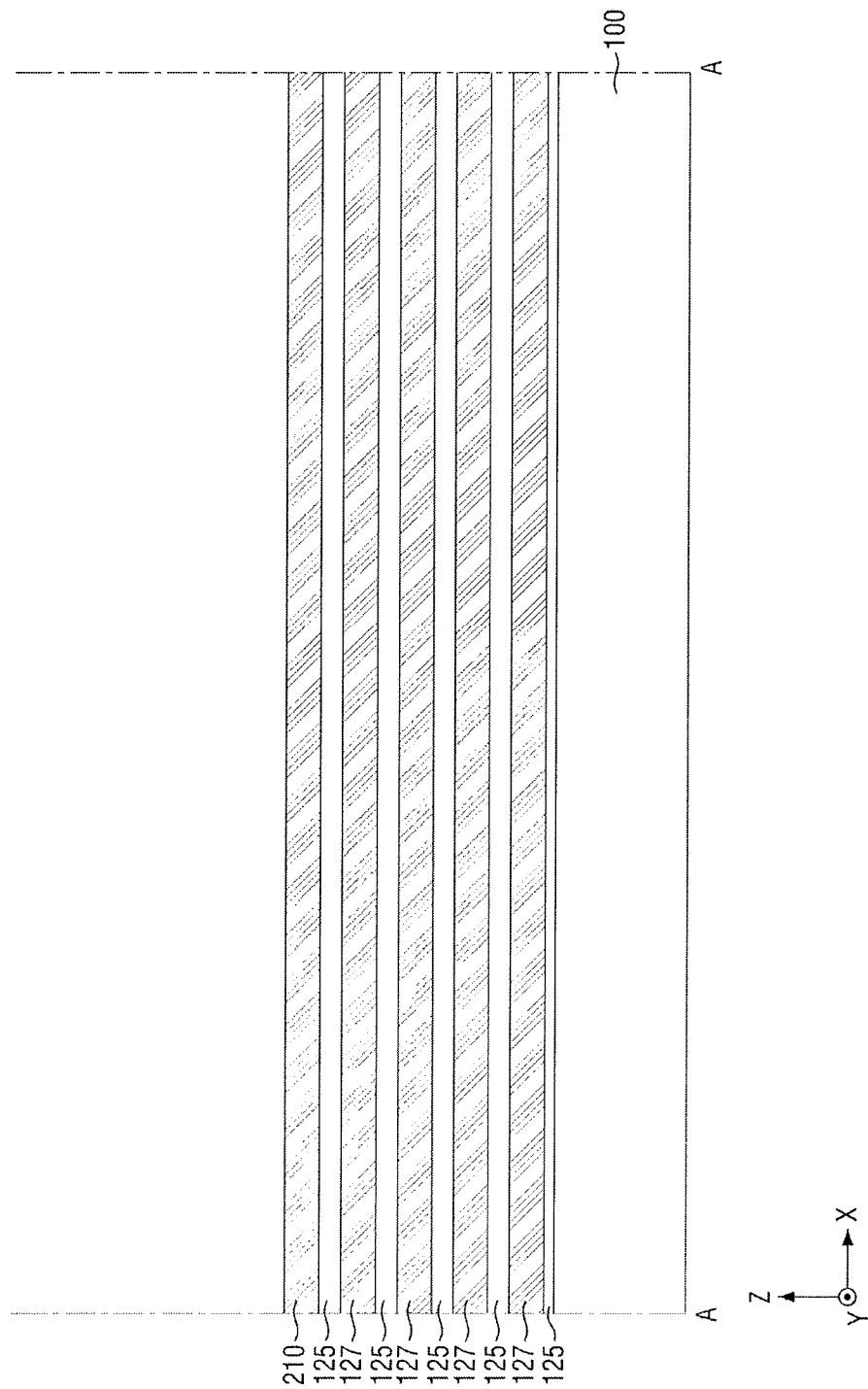
FIGS. 13 to 22 illustrate cross-sectional views of stages in a method for fabricating a nonvolatile memory device according to some embodiments.

Referring to FIG. 13, a plurality of first sacrificial patterns 127, the plurality of insulating patterns 125, and a second sacrificial pattern 210 are formed on the substrate 100.

The respective first sacrificial patterns 127 may be stacked alternately with the respective insulating patterns 125. For example, the plurality of first sacrificial patterns 127 may be spaced apart from one another along the third direction Z and sequentially stacked. At this time, each insulating pattern 125 may be interposed between the plurality of first sacrificial patterns 127.

The plurality of first sacrificial patterns 127 may include a material having an etch selectivity with the plurality of insulating patterns 125. For example, when the plurality of insulating patterns 125 include silicon oxide, the plurality of first sacrificial patterns 127 may include polysilicon.

The second sacrificial pattern 210 may be stacked on the plurality of first sacrificial patterns 127. For example, the second sacrificial pattern 210 may be formed on the uppermost first sacrificial pattern 127. Also, the second sacrificial pattern 210 may be spaced apart from the uppermost first sacrificial pattern 127 by the insulating pattern 125.

In some embodiments, the second sacrificial pattern 210 may include a material having an etch selectivity with the plurality of insulating patterns 125. For example, if the plurality of insulating patterns 125 include silicon oxide, the second sacrificial pattern 210 may include polysilicon.

Figure 14:
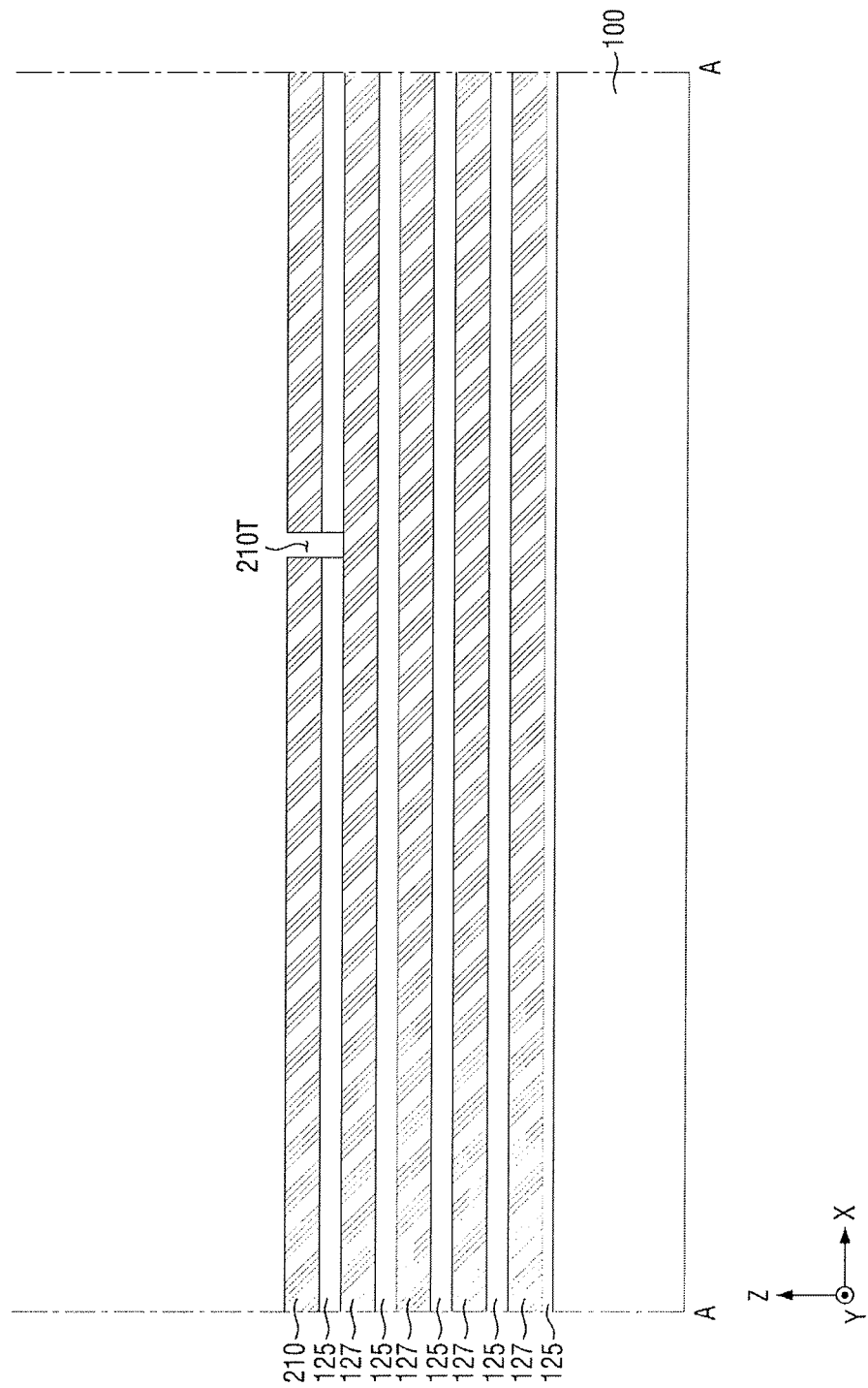

Referring to FIG. 14, the second sacrificial pattern 210 is cut. For example, a trench 210T which cuts the second sacrificial pattern 210 may be formed in the second sacrificial pattern 210. The trench 210T may be formed, e.g., by etching apart of the second sacrificial pattern 210.

In some embodiments, the trench 210T may extend in the first direction Y. In some embodiments, a bottom surface of the trench 210T may be lower than a bottom surface of the second sacrificial pattern 210. For example, the trench 210T may also penetrate the insulating pattern 125 disposed under the second sacrificial pattern 210 to expose an upper surface of the first sacrificial pattern 127.

Although it is shown that cutting of the second sacrificial pattern 210 is performed in a state in which the upper surface of the second sacrificial pattern 210 is exposed, this is merely an example. For example, cutting of the second sacrificial pattern 210 may be performed in a state in which the upper surface of the insulating pattern 125 is exposed after forming the insulating pattern 125 on the second sacrificial pattern 210.

Figure 15:
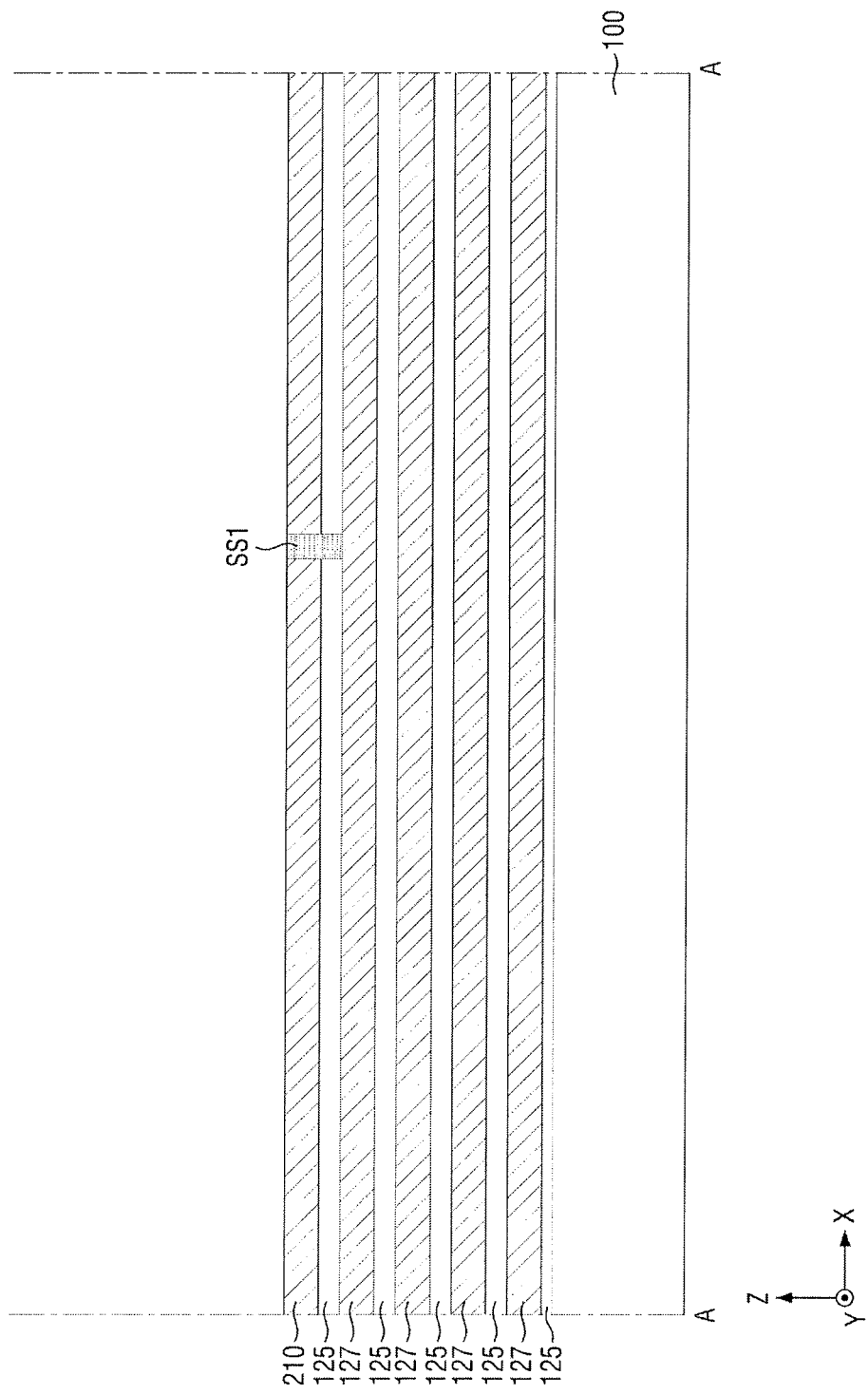

Referring to FIG. 15, the first cutting line SS1 for cutting the second sacrificial pattern 210 is formed. For example, an insulating material which fills the trench 210T is formed on the second sacrificial pattern 210, and then, a planarization process may be performed. Thus, the first cutting line SS1 for filling the trench 210T may be formed. The insulating material may include, e.g., at least one of silicon oxide, silicon nitride, and silicon oxynitride.

Figure 16:
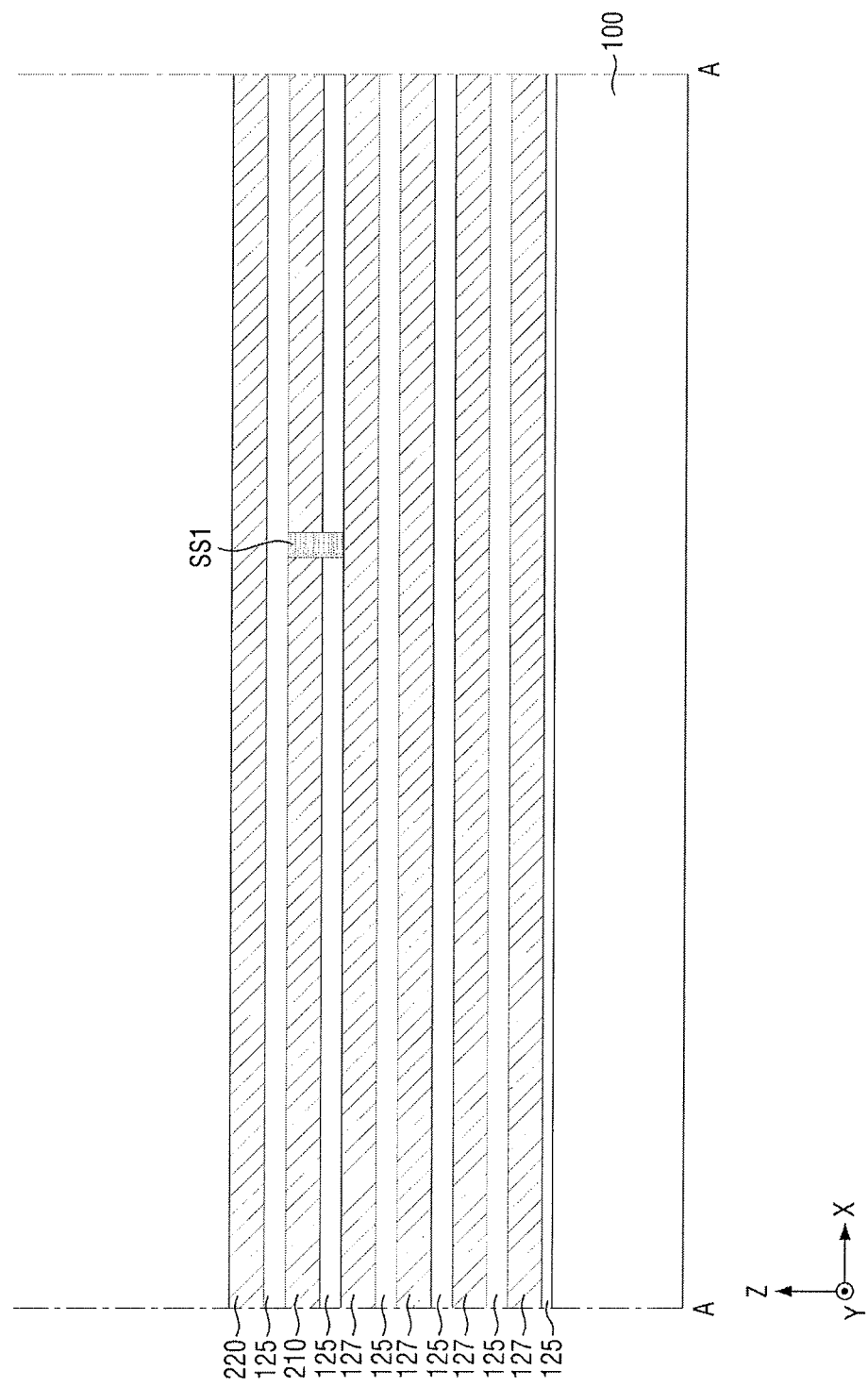

Referring to FIG. 16, a third sacrificial pattern 220 is formed on the second sacrificial pattern 210 and the first cutting line SS1. The third sacrificial pattern 220 may be stacked on the second sacrificial pattern 210 and the first cutting line SSL. Also, the third sacrificial pattern 220 may be spaced apart from the second sacrificial pattern 210 by the insulating pattern 125.

In some embodiments, the third sacrificial pattern 220 may include a material having an etch selectivity with the plurality of insulating patterns 125. For example, if the plurality of insulating patterns 125 include silicon oxide, the third sacrificial pattern 220 may include polysilicon.

Figure 17:
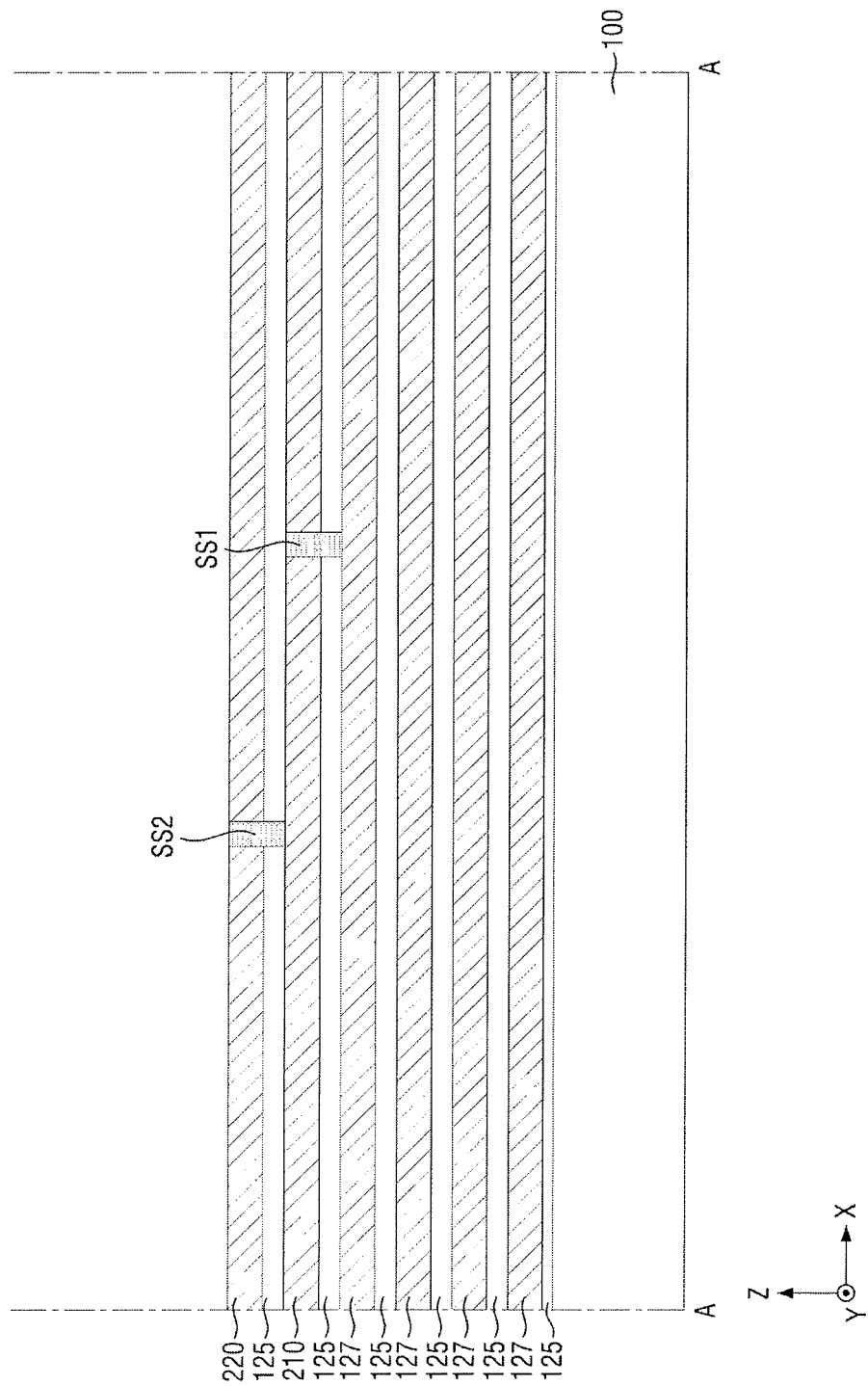

Referring to FIG. 17, a second cutting line SS2 which cuts the third sacrificial pattern 220 is formed. Since the formation of the second cutting line SS2 is similar to formation of the first cutting line SS1 described above in the description of FIGS. 14 and 15, a detailed description will not be provided below.

In a plan view, the second cutting line SS2 may be spaced apart from the first cutting line SS1. For example, the second cutting line SS2 may be spaced apart from the first cutting line SS1 in the first direction Y. In some embodiments, the first cutting line SS1 and the second cutting line SS2 may not overlap each other in a plan view.

However, the second cutting line SS2 may not cut the first string selection line SSL_L. For example, the bottom surface of the second cutting line SS2 may be formed to be higher than or the same as the upper surface of the first string selection line SSL_L.

As a result, none of the sacrificial patterns may be cut by the plurality of cutting lines. For example, the second sacrificial pattern 210 may be cut only by one cutting line (the first cutting line SS1), and the third sacrificial pattern 220 may also be cut only by one cutting line (the second cutting line SS2).

Figure 18:
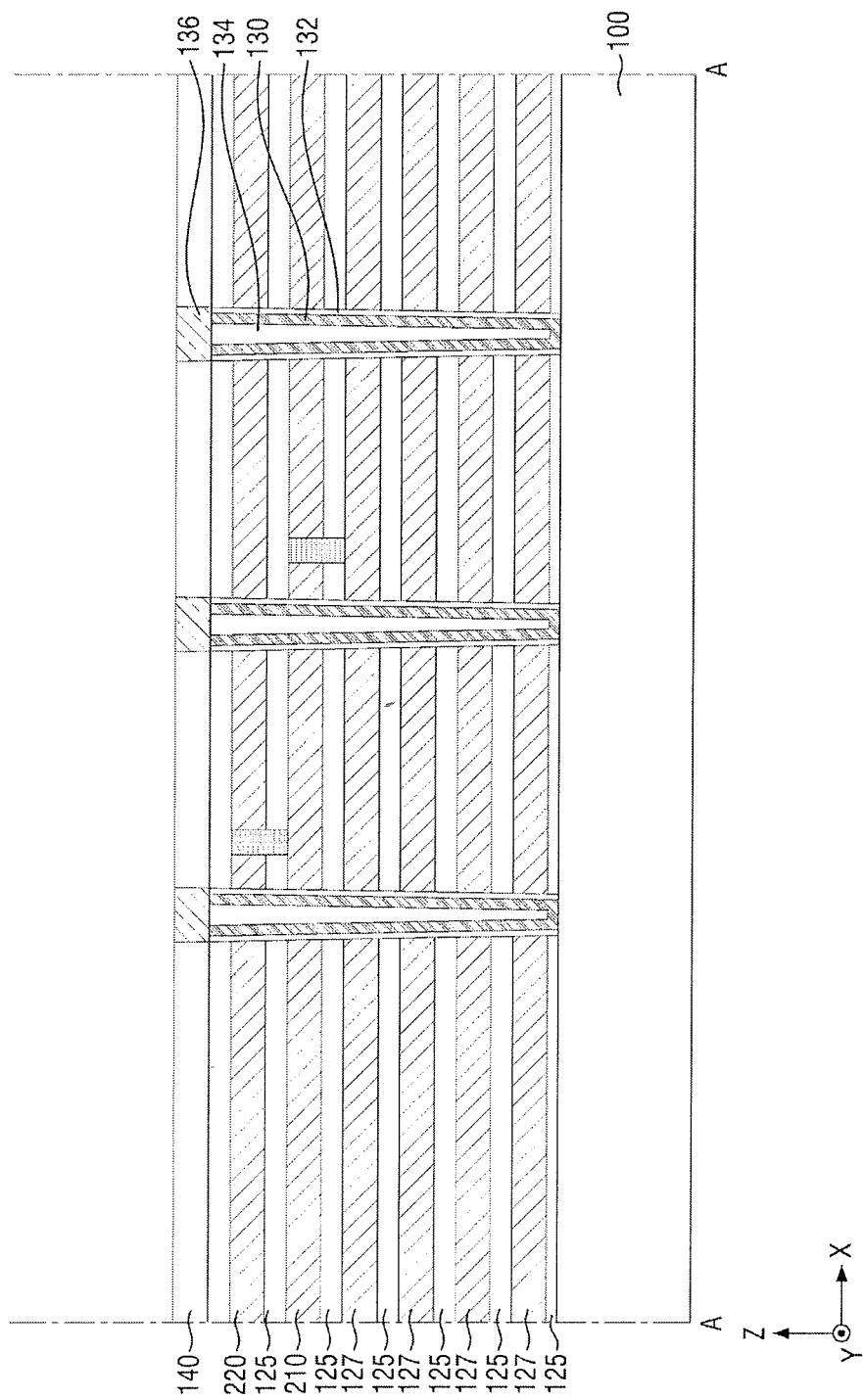

Referring to FIG. 18, the plurality of channel structures CS1 to CS6, which penetrates the plurality of first sacrificial patterns 127, the plurality of insulating patterns 125, the second sacrificial pattern 210, and the third sacrificial pattern 220, and is connected to the substrate 100, is formed. For example, penetration holes, which penetrate the plurality of first sacrificial patterns 127, the plurality of insulating patterns 125, the second sacrificial pattern 210, and the third sacrificial pattern 220 to expose the substrate 100, may be formed. Subsequently, the information storage film 132 and the semiconductor pattern 130 sequentially stacked in the penetration holes may be formed.

In some embodiments, the filled insulating pattern 134 may be further formed on the semiconductor pattern 130. The filled insulating pattern 134 may be formed, e.g., to fill the inside of the cup-shaped semiconductor pattern 130.

In some embodiments, the channel pad 136 may be further formed on the semiconductor pattern 130. The channel pad 136 may be formed, e.g., to be connected to the upper part of the semiconductor pattern 130.

Figure 19:
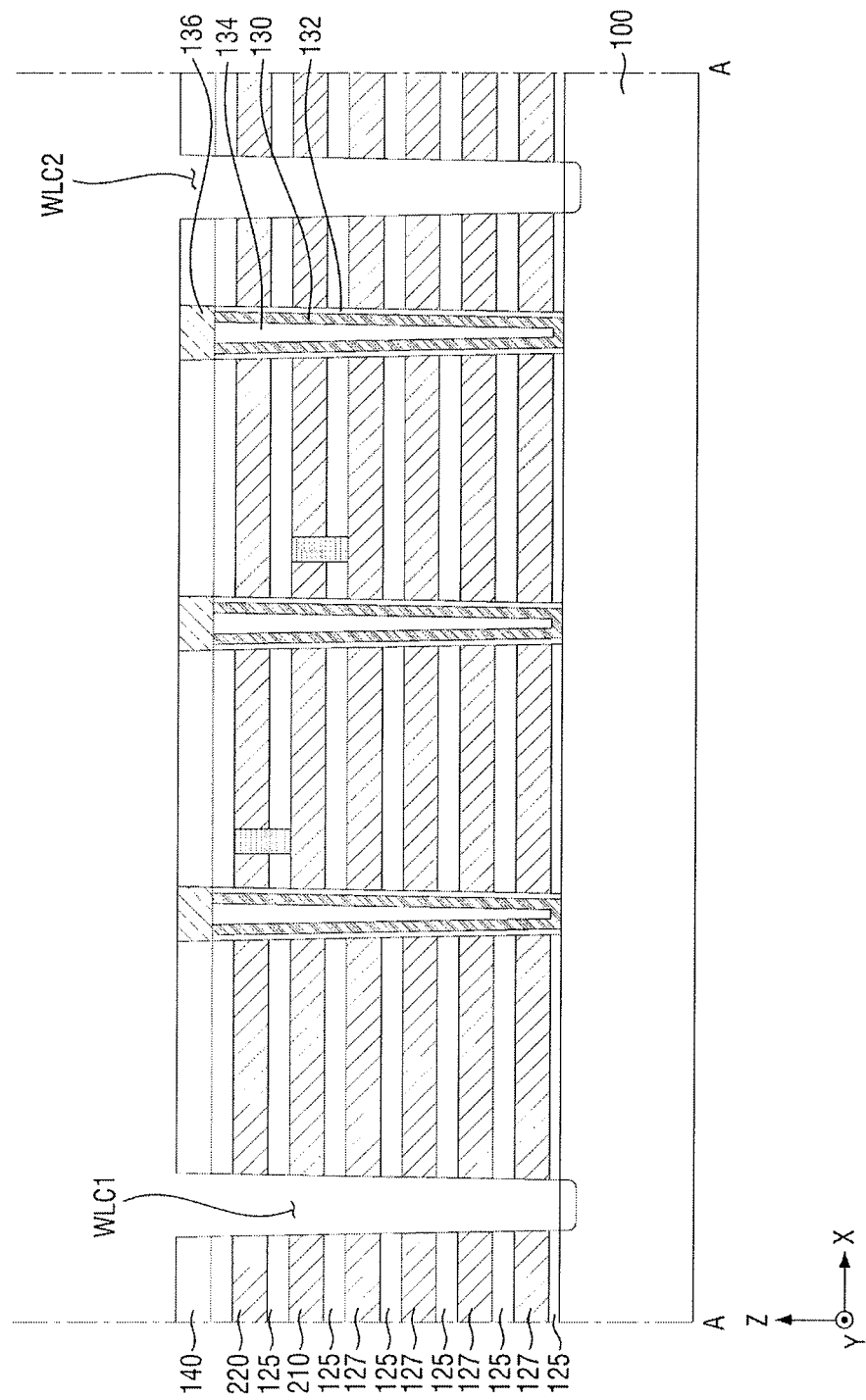

Referring to FIG. 19, the first word line cutting region WLC1 and the second word line cutting region WLC2 are formed in the plurality of first sacrificial patterns 127, the plurality of insulating patterns 125, the second sacrificial patterns 210, and the third sacrificial patterns 220. The first word line cutting region WLC1 and the second word line cutting region WLC2 may be formed to penetrate the plurality of first sacrificial patterns 127, the plurality of insulating patterns 125, the second sacrificial pattern 21,0 and the third sacrificial pattern 220 to expose the substrate 100. As a result, the first word line cutting region WLC1 and the second word line cutting region WLC2 may cut the plurality of first sacrificial patterns 127, the plurality of insulating patterns 125, the second sacrificial pattern 210, and the third sacrificial pattern 220.

In some implementations, each of the first word line cutting region WLC1 and the second word line cutting region WLC2 may be formed to extend side by side along the first direction Y. In some embodiments, an impurity region 105 may be formed in the substrate 100 exposed by the first word line cutting region WLC1 and the second word line cutting region WLC2.

Figure 20:
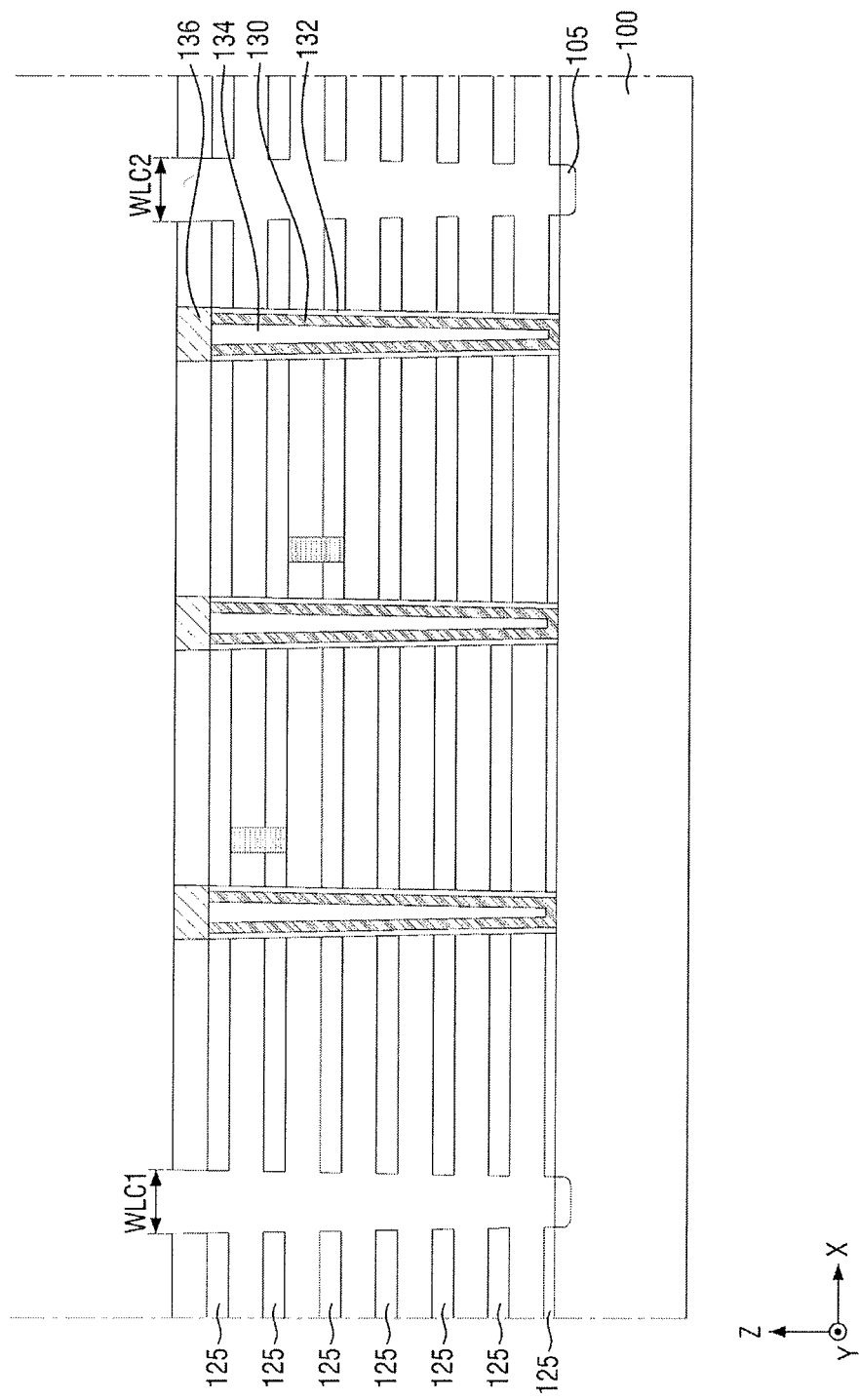

Referring to FIG. 20, the plurality of first sacrificial patterns 127, the second sacrificial pattern 210, and the third sacrificial pattern 220 exposed by the first word line cutting region WLC1 and the second word line cutting region WLC2 are removed. The removal of the plurality of first sacrificial patterns 127, the second sacrificial pattern 210, and the third sacrificial pattern 220 may be performed by, e.g., an anisotropic etching process.

On the other hand, since none of the sacrificial patterns are cut by the two cutting lines, the plurality of first sacrificial patterns 127, the second sacrificial pattern 210, and the third sacrificial pattern 220 may be completely removed.

If the second sacrificial pattern 210 were to cut by the first cutting line SS1 and the second cutting line SS2, since both the first cutting line SS1 and the second cutting line SS2 are interposed between the first word line cutting region WLC1 and the second word line cutting region WLC2, the second sacrificial pattern 210 between the first cutting line SS1 and the second cutting line SS2 would not have been removed. However, in the method for fabricating the nonvolatile memory device according to some embodiments, since one side of the first cutting line SS1 is exposed by the first word line cutting region WLC1, and the other side of the first cutting line SS1 is exposed by the second word line cutting region WLC2, the second sacrificial pattern 210 between the first cutting line SS1 and the second cutting line SS2 may also be removed. Also, in the method for fabricating the nonvolatile memory device according to some embodiments, since one side of the second cutting line SS2 is exposed by the first word line cutting region WLC1, and the other side of the second cutting line SS2 is exposed by the second word line cutting region WLC2, the third sacrificial pattern 220 between the first cutting line SS1 and the second cutting line SS2 may also be removed.

Figure 21:
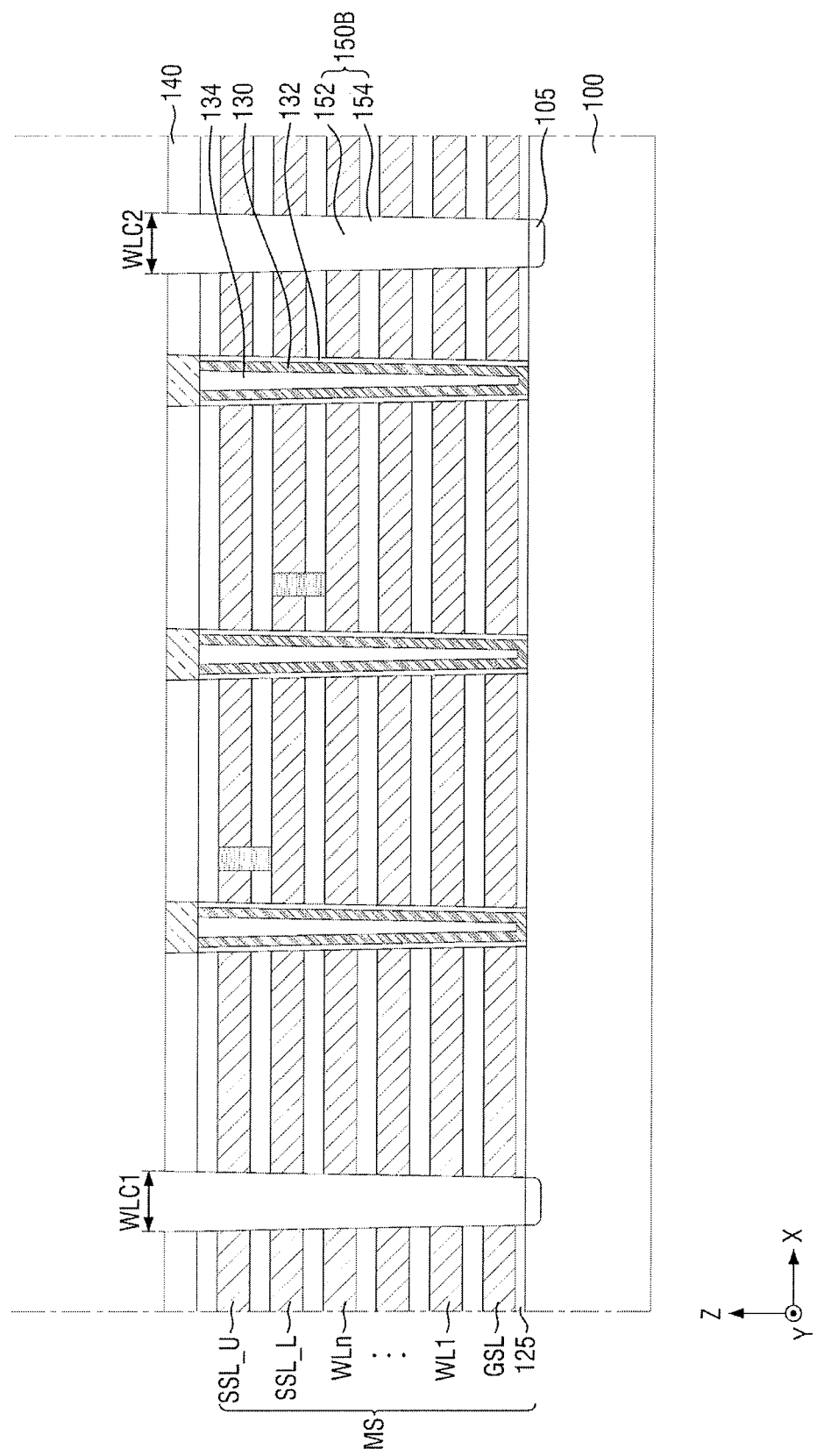

Referring to FIG. 21, a plurality of gate electrodes GSL, WL1 to WLn, SSL_L, and SSL_U are formed on the substrate 100. The plurality of gate electrodes GSL, WL1 to WLn, SSL_L, and SSL_U may be formed in a region in which the plurality of first sacrificial patterns 127, the second sacrificial pattern 210, and the third sacrificial pattern 220 are removed. That is, the first sacrificial patterns 127, the second sacrificial pattern 210, and the third sacrificial pattern 220 may be replaced with the plurality of gate electrodes GSL, WL1 to WLn, SSL_L, and SSL_U.

Specifically, the plurality of first sacrificial patterns 127 may be replaced with the ground selection line GSL and the plurality of word lines WL1 to WLn. The second sacrificial pattern 210 may be replaced with the first string selection line SSL_L. The third sacrificial pattern 220 may be replaced with the second string selection line SSL_U. Thus, the first cutting line SS1 may cut the first string selection line SSL_L, and the second cutting line SS2 may cut the second string selection line SSL_U.

Figure 22:
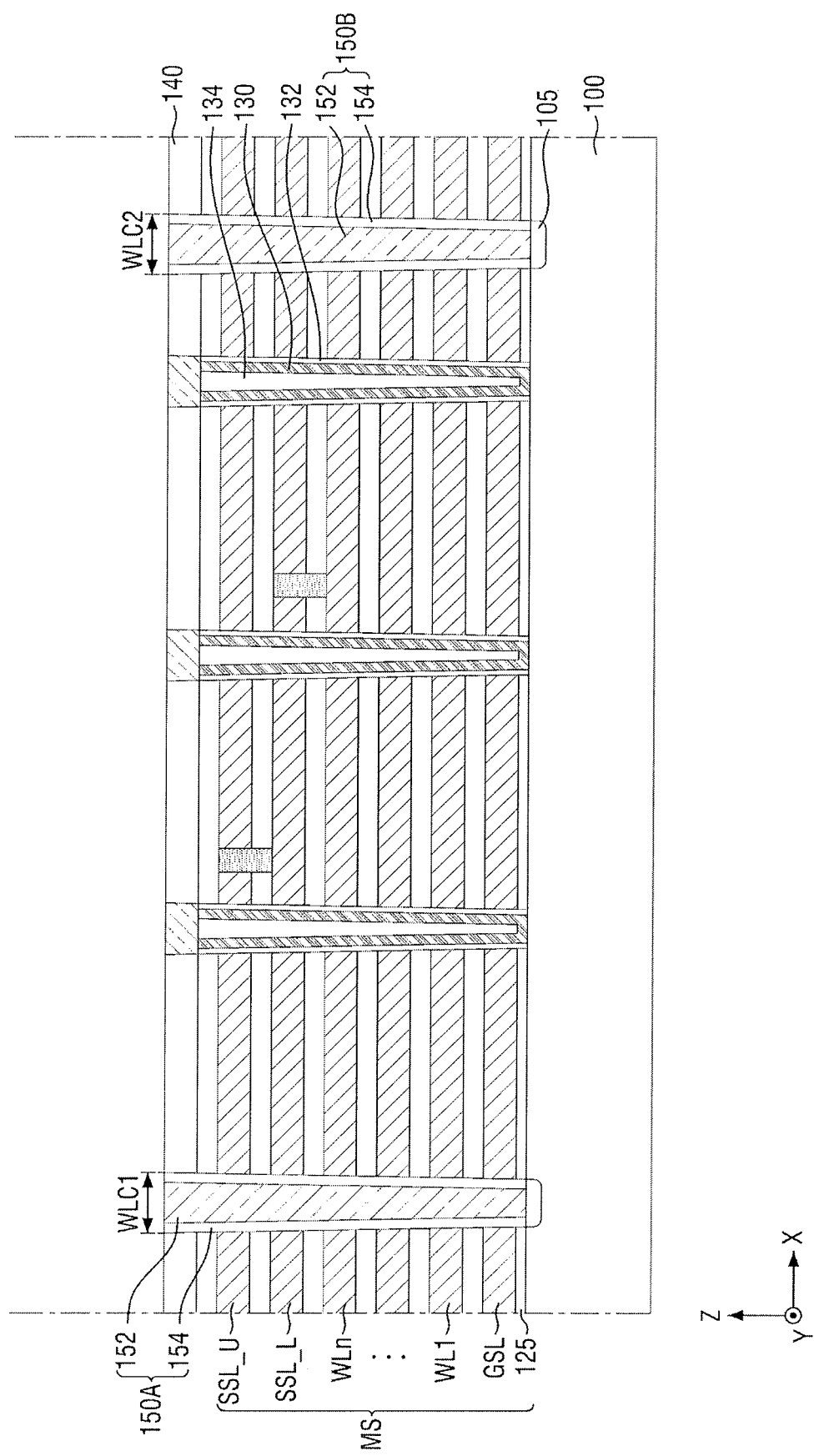

Referring to FIG. 22, the first cutting structure 150A and the second cutting structure 150B are formed in the first word line cutting region WLC1 and the second word line cutting region WLC2. The first cutting structure 150A may be formed in the first word line cutting region WLC1, and the second cutting structure 150B may be formed in the second word line cutting region WLC2. In some embodiments, the first cutting structure 150A and the second cutting structure 150B may include the plug pattern 152 and the spacer 154, respectively.

Subsequently, referring to FIG. 2, the plurality of bit lines BL1 and BL2 is formed on the mold structure MS. The plurality of bit lines BL1 and BL2 may be formed to be connected to the plurality of channel structures CS1 to CS6. For example, the second interlayer insulating film 160 may be formed on the mold structure MS. Subsequently, the bit line contact 170 which penetrates the second interlayer insulating film 160 to electrically connect the respective channel structures CS1 to CS6 and the respective bit lines BL1 and BL2 may be formed.

By way of summation and review, aspects of the present disclosure provide a nonvolatile memory device having improved degree of integration. Aspects of the present disclosure also provide a method for fabricating a nonvolatile memory device having improved degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
a mold structure on a substrate, the mold structure including a stack of word lines and string selection lines, and the string selection lines including first and second string selection lines on the word lines;
a first cutting structure through the mold structure;
a second cutting structure through the mold structure, the second cutting structure being spaced apart from the first cutting structure;
a channel structure penetrating the mold structure to be connected to the substrate, the channel structure being between the first and second cutting structures;
a first cutting line through the first string selection line but not through the second string selection line, the first cutting line being between the first and second cutting structures; and
a second cutting line through the second string selection line but not through the first string selection line, the second cutting line being between the second cutting structure and the channel structure.

2. The nonvolatile memory device as claimed in claim 1, wherein the mold structure further includes a third string selection line on the word lines and adjacent to the first string selection line, the first cutting line extending through the first and third string selection lines.

3. The nonvolatile memory device as claimed in claim 2, wherein the first and second cutting structures extend side by side along a first direction.

4. The nonvolatile memory device as claimed in claim 3, wherein the first and second cutting lines extend side by side along the first direction.

5. The nonvolatile memory device as claimed in claim 3, wherein the first and second cutting lines extend side by side along a second direction intersecting the first direction, the first and second cutting lines being spaced apart from each other in the first direction.

6. The nonvolatile memory device as claimed in claim 3, further comprising a bit line on the mold structure and electrically connected to the channel structure, the bit line extending in a second direction intersecting the first direction.

7. The nonvolatile memory device as claimed in claim 1, further comprising a dummy channel structure through the mold structure and spaced apart from the channel structure, the dummy channel structure being connected to the substrate and crossing the first string selection line.

8. The nonvolatile memory device as claimed in claim 1, wherein the first and second cutting lines do not overlap each other in a plan view.

9. The nonvolatile memory device as claimed in claim 1, wherein the first cutting line has a zigzag shape in a plan view.

10. The nonvolatile memory device as claimed in claim 1, wherein the first and second cutting lines include an insulating material.

11. A nonvolatile memory device, comprising:
a mold structure including a plurality of word lines, a first string selection line, and a second string selection line sequentially stacked on a substrate in the stated order;
first to third channel structures penetrating the mold structure to be connected to the substrate, the first to third channel structures being arranged sequentially;
a first cutting line through the first string selection line between the first channel structure and the second channel structure; and
a second cutting line through the second string selection line between the second channel structure and the third channel structure,
wherein an upper surface of the first cutting line is lower than or equal to a bottom surface of the second string selection line, and a bottom surface of the second cutting line is higher than or equal to an upper surface of the first string selection line.

12. The nonvolatile memory device as claimed in claim 11, further comprising a bit line on the mold structure and overlapping the first and second cutting lines, as viewed in a plan view, the bit line being electrically connected to the first to third channel structures.

13. The nonvolatile memory device as claimed in claim 11, wherein the first and second cutting lines extend side by side along a first direction, and the first to third channel structures are arranged in a row along a second direction intersecting the first direction.

14. The nonvolatile memory device as claimed in claim 11, wherein the mold structure further includes:
   a third string selection line on the second string selection line;
   a fourth channel structure penetrating the mold structure and connected to the substrate, the fourth channel structure being spaced apart from the first to third channel structures; and
   a third cutting line through a third string selection line between the third channel structure and the fourth channel structure.

15. The nonvolatile memory device as claimed in claim 11, wherein a bottom surface of the first cutting line is lower than a bottom surface of the first string selection line.

16. The nonvolatile memory device as claimed in claim 11, wherein an upper surface of the first cutting line is higher than an upper surface of the first string selection line.

17. A nonvolatile memory device, comprising:
   a mold structure on a substrate, the mold structure including a plurality of word lines and n string selection lines sequentially stacked on the substrate in the stated order, n being a natural number of 2 or more;
   a first word line cutting region through the mold structure;
   a second word line cutting region through the mold structure, the second word line cutting region being spaced apart from the first word line cutting region; and
   n cutting lines through each of the n string selection lines, between the first word line cutting region and the second word line cutting region, the n cutting lines extending through different ones of the n string selection lines, respectively, and being spaced apart from each other in a plan view.

18. The nonvolatile memory device as claimed in claim 17, wherein the first and second word line cutting regions extend side by side along a first direction.

19. The nonvolatile memory device as claimed in claim 18, wherein each of the n cutting lines extends in the first direction, the n cutting lines having a non-overlapping relationship in a horizontal direction.

20. The nonvolatile memory device as claimed in claim 18, further comprising (n+1) channel structures which penetrate the mold structure, are connected to the substrate, and spaced apart from one another by the n cutting lines, the (n+1) channel structures being arranged in a row along a second direction intersecting the first direction.

* * * * *